(12) United States Patent
Sun et al.

(10) Patent No.: US 9,337,170 B1
(45) Date of Patent: May 10, 2016

(54) CONTACT ARRANGEMENTS FOR STACKABLE MICROELECTRONIC PACKAGE STRUCTURES

(71) Applicant: Invensas Corporation, San Jose, CA (US)

(72) Inventors: Zhuowen Sun, Campbell, CA (US); Yong Chen, Palo Alto, CA (US); Kyong-Mo Bang, Fremont, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/609,878

(22) Filed: Jan. 30, 2015

(51) Int. Cl.
| | |
|---|---|
| H01L 29/40 | (2006.01) |
| H01L 25/065 | (2006.01) |
| H01L 23/498 | (2006.01) |
| H01L 25/00 | (2006.01) |
| H01L 21/48 | (2006.01) |

(52) U.S. Cl.
CPC ........ *H01L 25/0652* (2013.01); *H01L 21/4846* (2013.01); *H01L 21/4853* (2013.01); *H01L 23/49833* (2013.01); *H01L 23/49838* (2013.01); *H01L 25/50* (2013.01); *H01L 2225/0651* (2013.01); *H01L 2225/06517* (2013.01); *H01L 2225/06527* (2013.01); *H01L 2225/06555* (2013.01); *H01L 2225/06572* (2013.01)

(58) Field of Classification Search
CPC ........... H01L 2924/15311; H01L 2224/49433; H01L 23/49816

USPC ................... 257/784, 785, 686; 438/106, 109
See application file for complete search history.

(56) References Cited

U.S. PATENT DOCUMENTS

| | | | | |
|---|---|---|---|---|
| 5,801,440 A | * | 9/1998 | Chu | H01L 23/3128 257/691 |
| 6,489,682 B1 | * | 12/2002 | Yeh | G01B 7/02 257/738 |
| 6,770,963 B1 | * | 8/2004 | Wu | H01L 23/50 257/691 |
| 8,597,986 B2 | | 12/2013 | Wang et al. | |
| 2005/0127501 A1 | * | 6/2005 | Khan | H01L 23/13 257/706 |
| 2006/0043587 A1 | * | 3/2006 | Lim | H01L 23/50 257/738 |
| 2012/0206889 A1 | * | 8/2012 | Norman | H01L 23/50 361/761 |
| 2015/0108628 A1 | | 4/2015 | Yu et al. | |
| 2015/0235915 A1 | | 8/2015 | Liang et al. | |

* cited by examiner

*Primary Examiner* — S. V. Clark

(57) ABSTRACT

An apparatus relates generally to a microelectronic assembly. In such an apparatus, a contact arrangements are disposed on a first surface of a first substrate, including first contacts disposed as a first ring array; second contacts disposed interior to the first contacts as a second ring array; third contacts disposed interior to the second contacts as a third ring array; and fourth contacts disposed interior to the third contacts on the first surface as an innermost array. The first ring array, the second ring array, and the third ring array are concentric rings with the innermost array in a central region of the concentric rings. The first contacts and the fourth contacts are for interconnection with first microelectronic dies. The second contacts and the third contacts are for interconnection with second microelectronic dies.

20 Claims, 25 Drawing Sheets

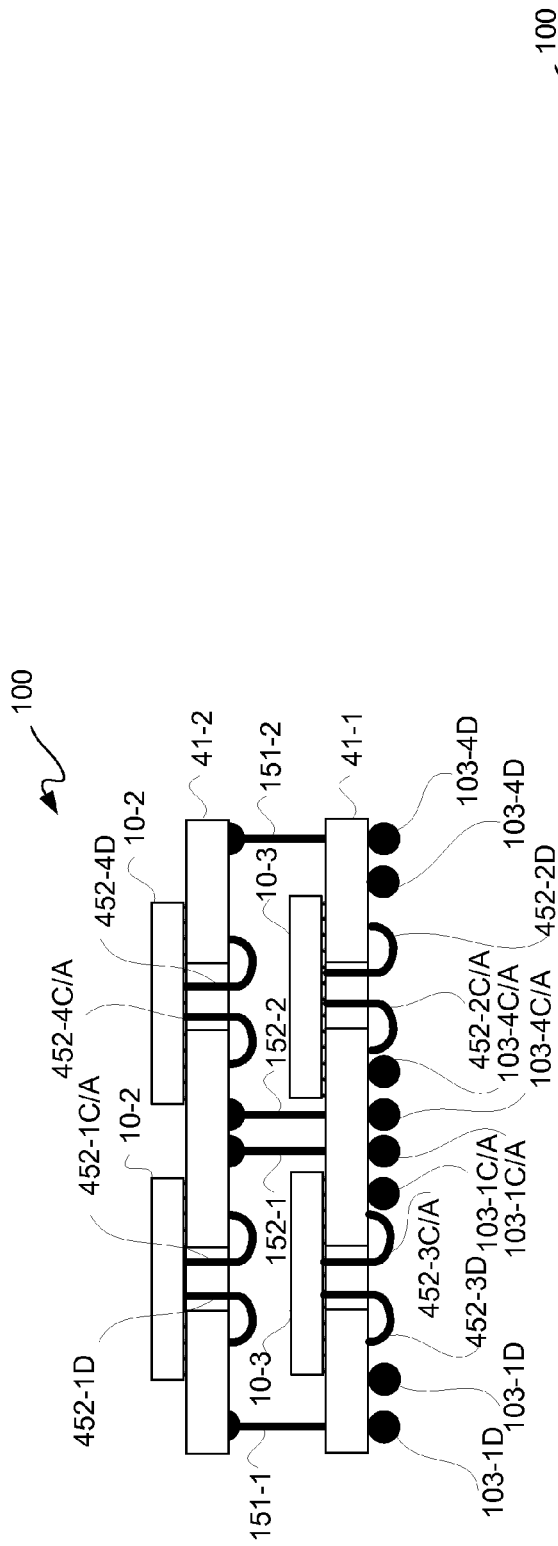
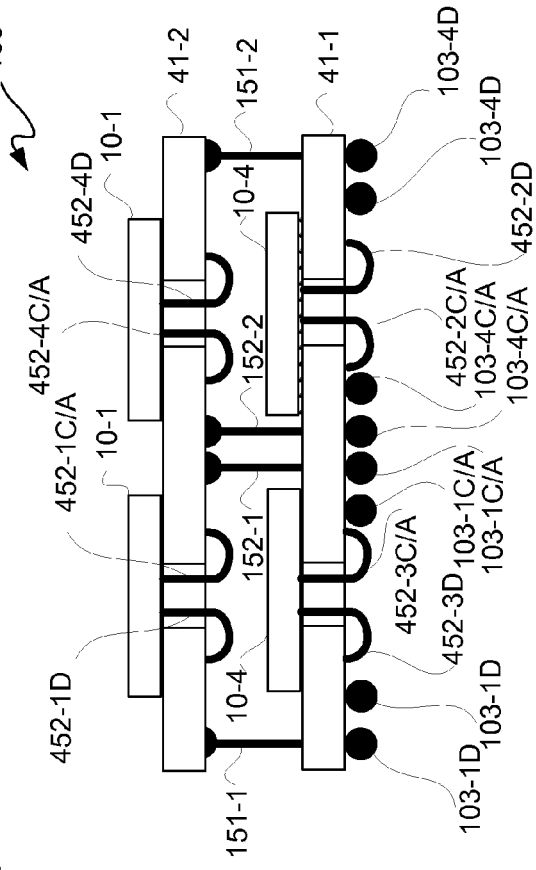
FIG. 18-1
FIG. 18-2

CONTACT ARRANGEMENTS FOR STACKABLE MICROELECTRONIC PACKAGE STRUCTURES

CROSS-REFERENCE TO RELATED APPLICATIONS

This application is related to a co-pending United States patent application entitled "Contact Arrangements for Stackable Microelectronic Package Structures with Multiple Ranks", commonly owned by the assignee hereof, having the same inventors as hereof, and filed on the same day hereof, which co-pending application is herein incorporated by reference in its entirety for all purposes.

FIELD

The following description relates to integrated circuits ("ICs"). More particularly, the following description relates to contact arrangements for stackable microelectronic package structures for a 3D IC.

BACKGROUND

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be an IC, and an interposer may be a passive or an active IC, where the latter includes one or more active devices, such as transistors for example, and the former does not include any active device. Furthermore, an interposer may be formed like a PWB, namely without any circuit elements such as capacitors, resistors, or active devices. Additionally, an interposer includes at least one through-substrate-via.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC. Additionally, a redistribution layer ("RDL") may be part of an IC to facilitate a flip-chip configuration, die stacking, or more convenient or accessible position of bond pads for example. Conventional interconnecting of multiple microelectronic dies in a memory package structure has issues with complexity and/or performance.

Accordingly, it would be desirable and useful to provide a layout of contacts that reduces such complexity and/or improves performance.

BRIEF SUMMARY

An apparatus relates generally to a microelectronic assembly. In such an apparatus, a first substrate has a first and a second surface on opposite sides of the first substrate. A plurality of contact arrangements is disposed on the first surface of the first substrate. The plurality of contact arrangements includes: first contacts disposed as a first ring array of the plurality of contact arrangements on the first surface; second contacts disposed interior to the first contacts as a second ring array of the plurality of contact arrangements on the first surface; third contacts disposed interior to the second contacts as a third ring array of the plurality of contact arrangements on the first surface; and fourth contacts disposed interior to the third contacts on the first surface as an innermost array of the plurality of contact arrangements on the first surface. The first ring array, the second ring array, and the third ring array are concentric rings with the innermost array in a first central region of the concentric rings. The first contacts and the fourth contacts are for interconnection with first microelectronic dies. The second contacts and the third contacts are for interconnection with second microelectronic dies.

Another apparatus relates generally to a microelectronic assembly. In such an apparatus, a first substrate has a first and a second surface on opposite sides of the first substrate. A plurality of contact arrangements is disposed on the first surface of the first substrate. The plurality of contact arrangements includes: first contacts disposed as a first block and a first L-shaped region spaced apart from one another in a first quadrant of the plurality of contact arrangements on the first surface; second contacts disposed as a second block and a second L-shaped region spaced apart from one another in a second quadrant of the plurality of contact arrangements on the first surface; third contacts disposed as a third block and a third L-shaped region spaced apart from one another in a third quadrant of the plurality of contact arrangements on the first surface; and fourth contacts disposed as a fourth block and a fourth L-shaped region spaced apart from one another in a fourth quadrant of the plurality of contact arrangements on the first surface. The first contacts and the fourth contacts are for interconnection with first microelectronic dies. The second contacts and the third contacts are for interconnection with second microelectronic dies.

A method relates generally to forming a microelectronic assembly. In such a method, a first substrate is obtained having a first surface and a second surface on opposite sides of the first substrate. A plurality of contact arrangements is formed on the first surface of the first substrate. The plurality of contact arrangements includes: first contacts disposed as a first ring array of the plurality of contact arrangements on the first surface; second contacts disposed interior to the first contacts as a second ring array of the plurality of contact arrangements on the first surface; third contacts disposed interior to the second contacts as a third ring array of the plurality of contact arrangements on the first surface; and fourth contacts disposed interior to the third contacts on the first surface. The first ring array, the second ring array, and the third ring array are concentric rings with the fourth contacts in a central region of the concentric rings. The first contacts and the fourth contacts are for interconnection with first microelectronic dies. The second contacts and the third contacts are for interconnection with second microelectronic dies in same a package as the first microelectronic dies.

Other features will be recognized from consideration of the Detailed Description and Claims, which follow.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIG. 1-2 is a block diagram of a cross-sectional view depicting another exemplary 3D IC packaged component with via structures.

FIG. 2 is schematic diagram depicting a bottom view a microelectronic assembly.

FIGS. 4-1 through 4-3 (singly and collectively FIG. 4) are respective schematic diagrams depicting corresponding cross-sectional views of various other implementations of microelectronic assemblies, such as for the microelectronic assembly of FIG. 2.

FIG. 6-1 is schematic diagram depicting a side cross-sectional perspective view of the microelectronic assembly of FIG. 5.

Figure 1:
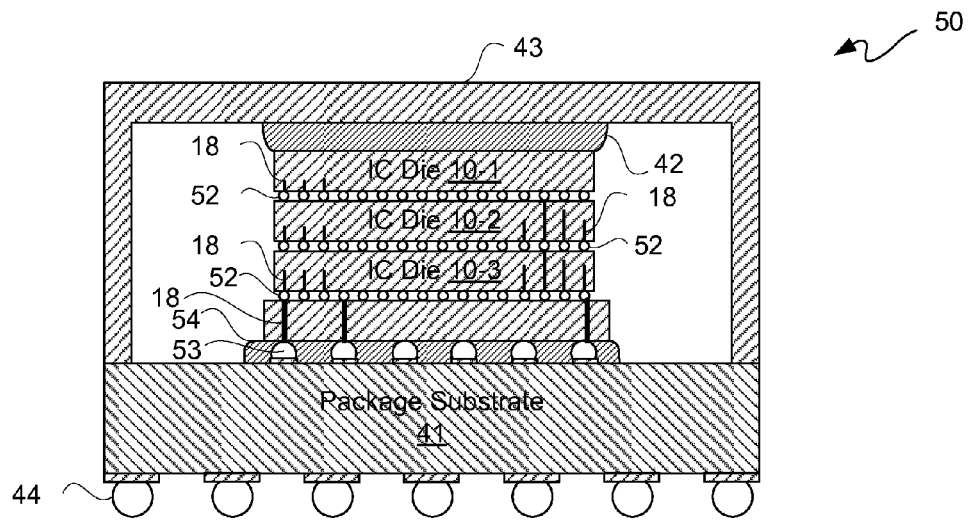
FIG. 1-1 is a block diagram of a cross-sectional view depicting an exemplary three-dimensional ("3D") IC packaged component with via structures.
Figures 1, 2:
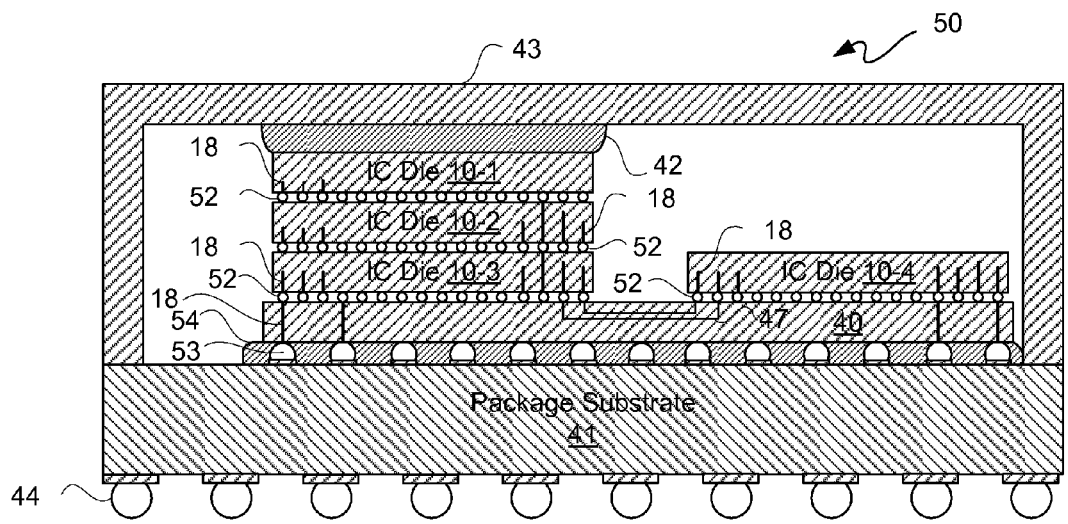
Figure 2:
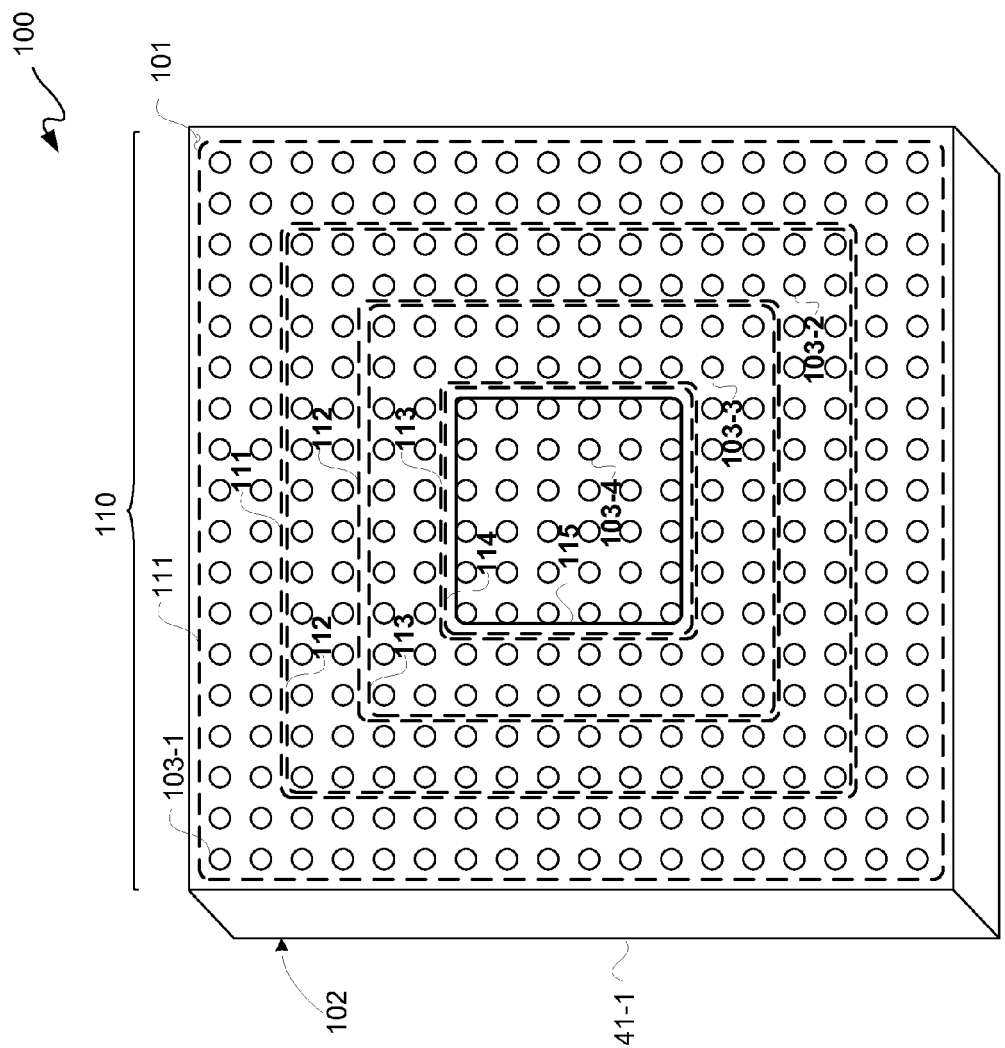
Figure 3:
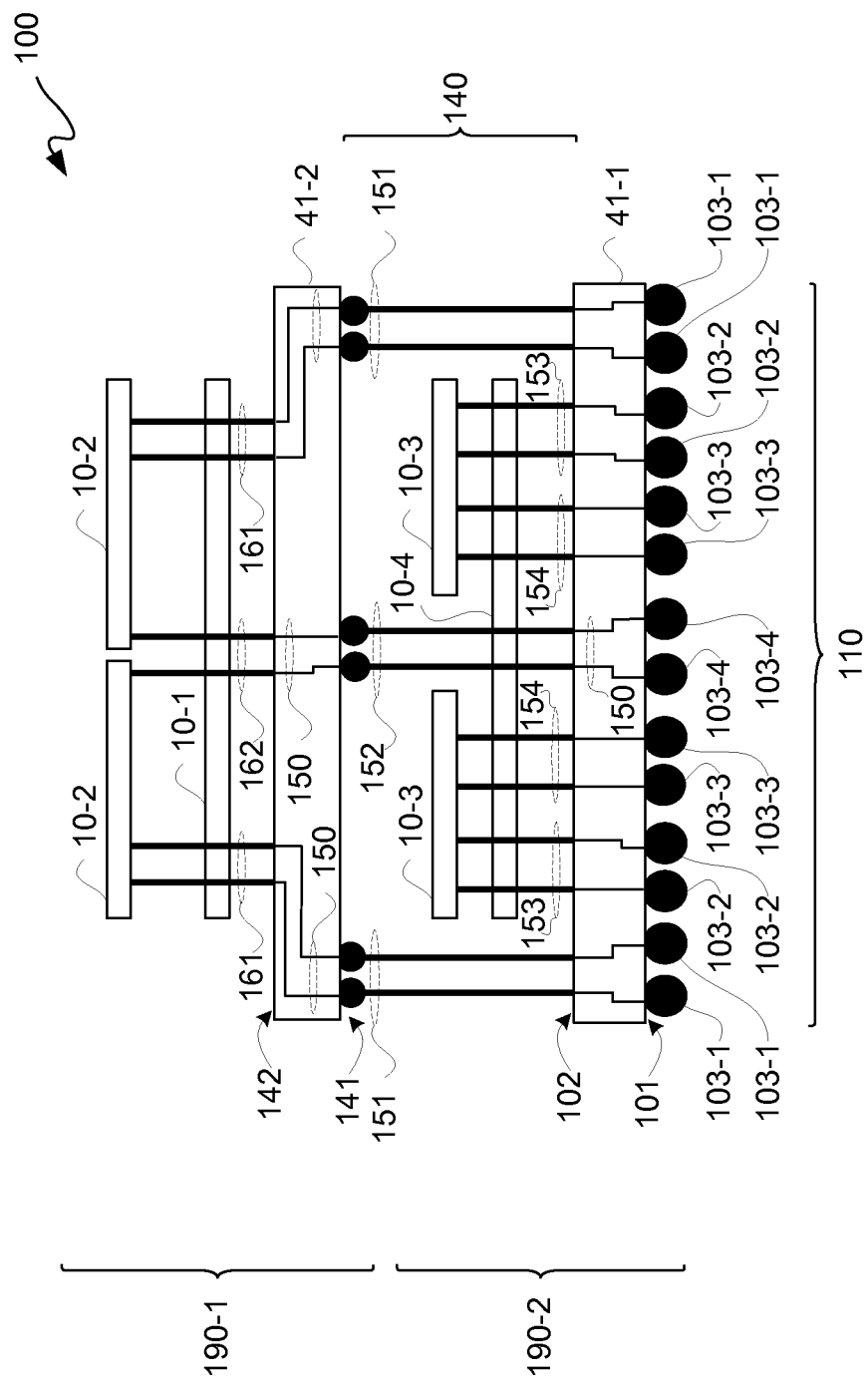
FIG. 3 is schematic diagram depicting a cross-sectional view of a microelectronic assembly, such as for the microelectronic assembly of FIG. 2.
Figure 5:
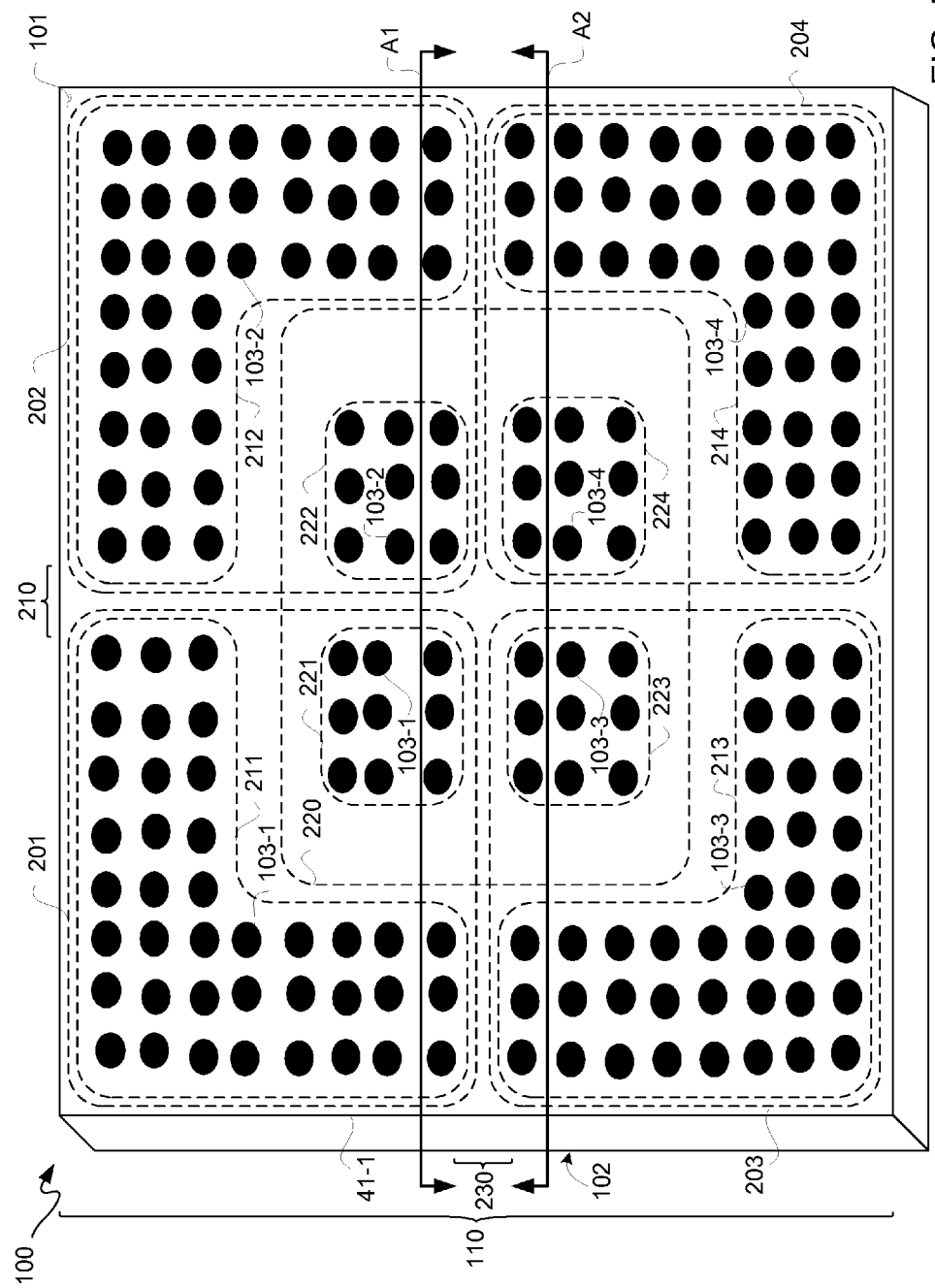
FIG. 5 is schematic diagram depicting a bottom view another microelectronic assembly.
Figures 1, 6:
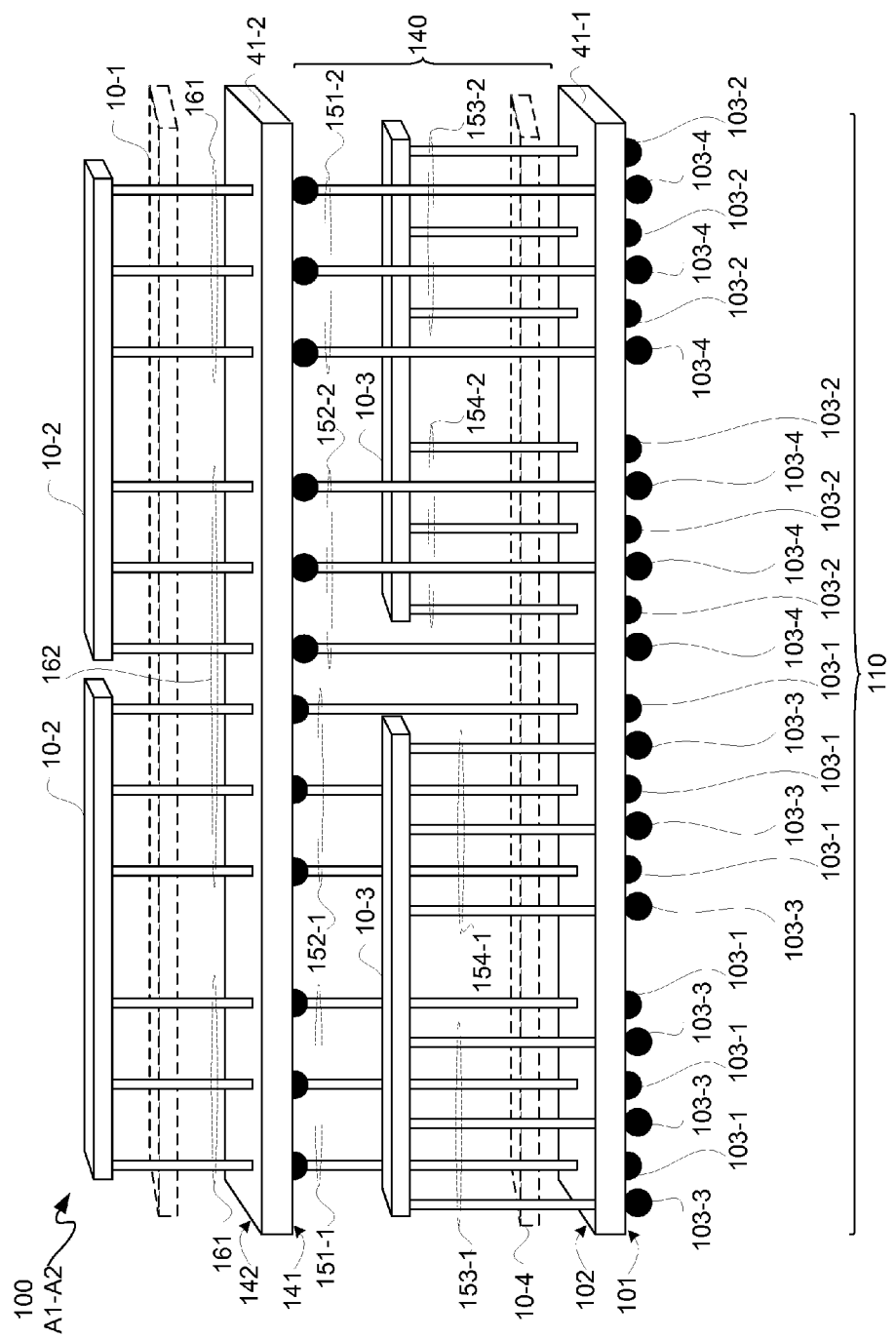
Figures 2, 6:
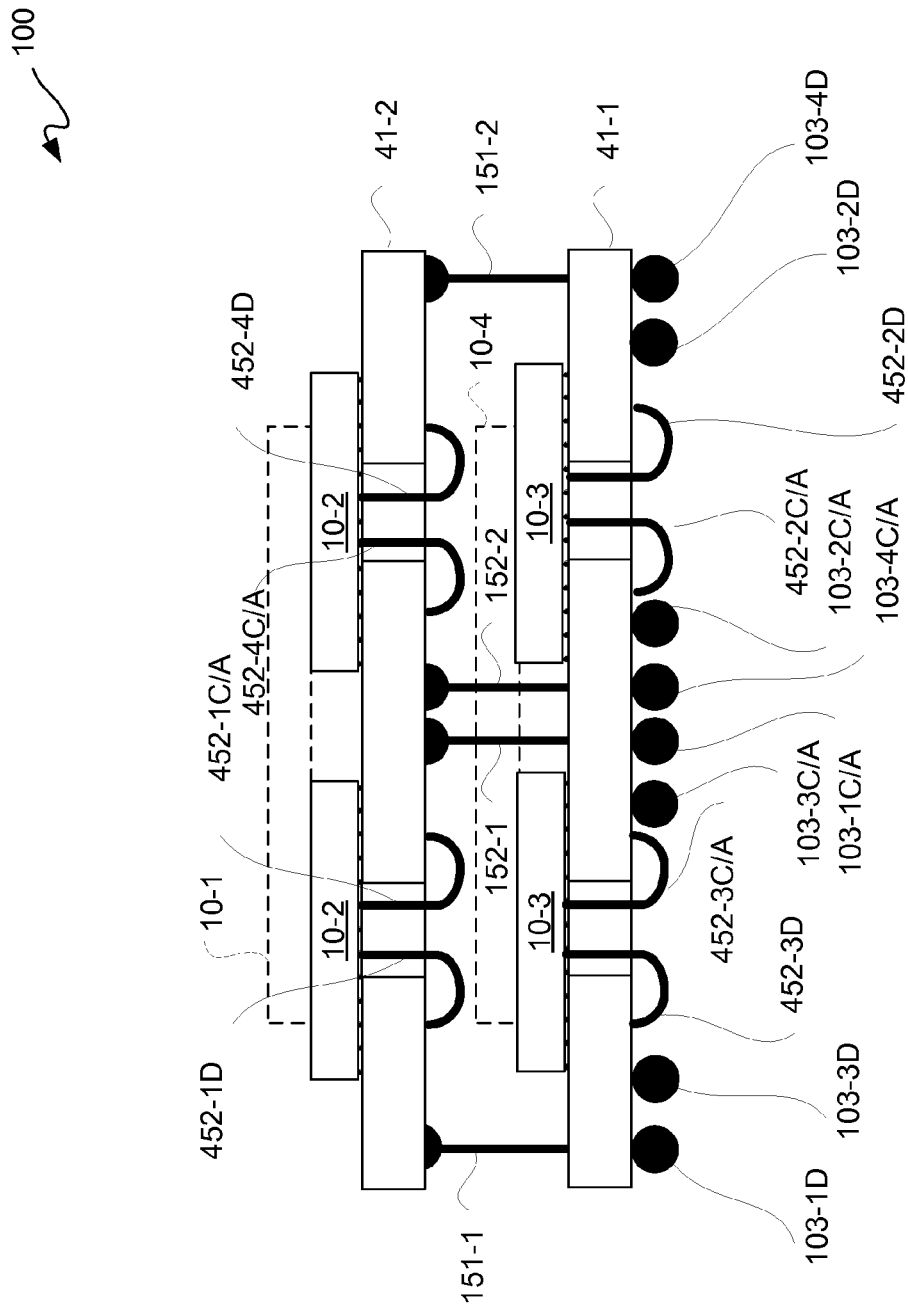
Figures 3, 6:
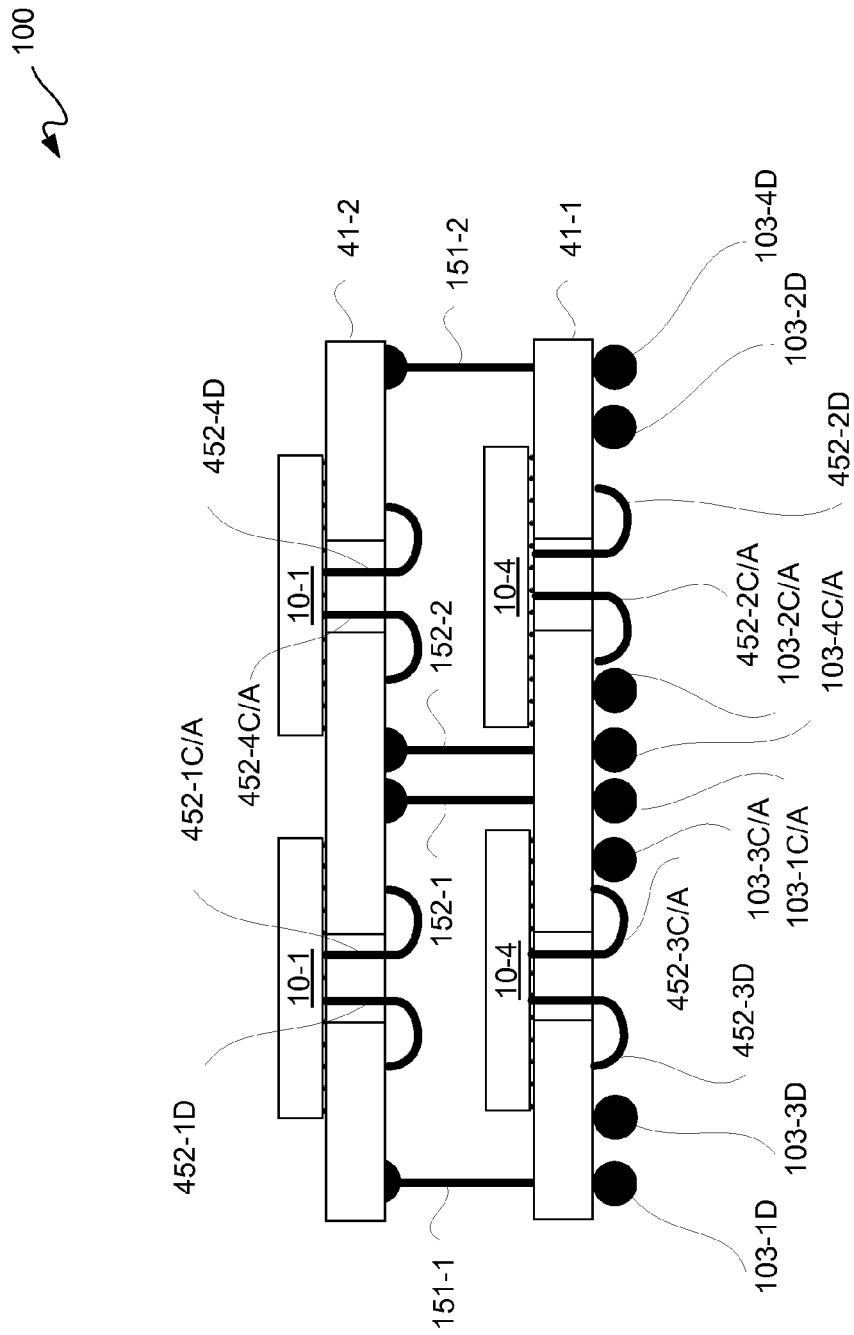

FIGS. 6-2 and 6-3 (FIGS. 6-1 through 6-3 are singly and collectively referred to as FIG. 6) are block diagrams depicting exemplary side cross-sectional views of another configuration of the microelectronic assembly of FIG. 5.

Figure 7:
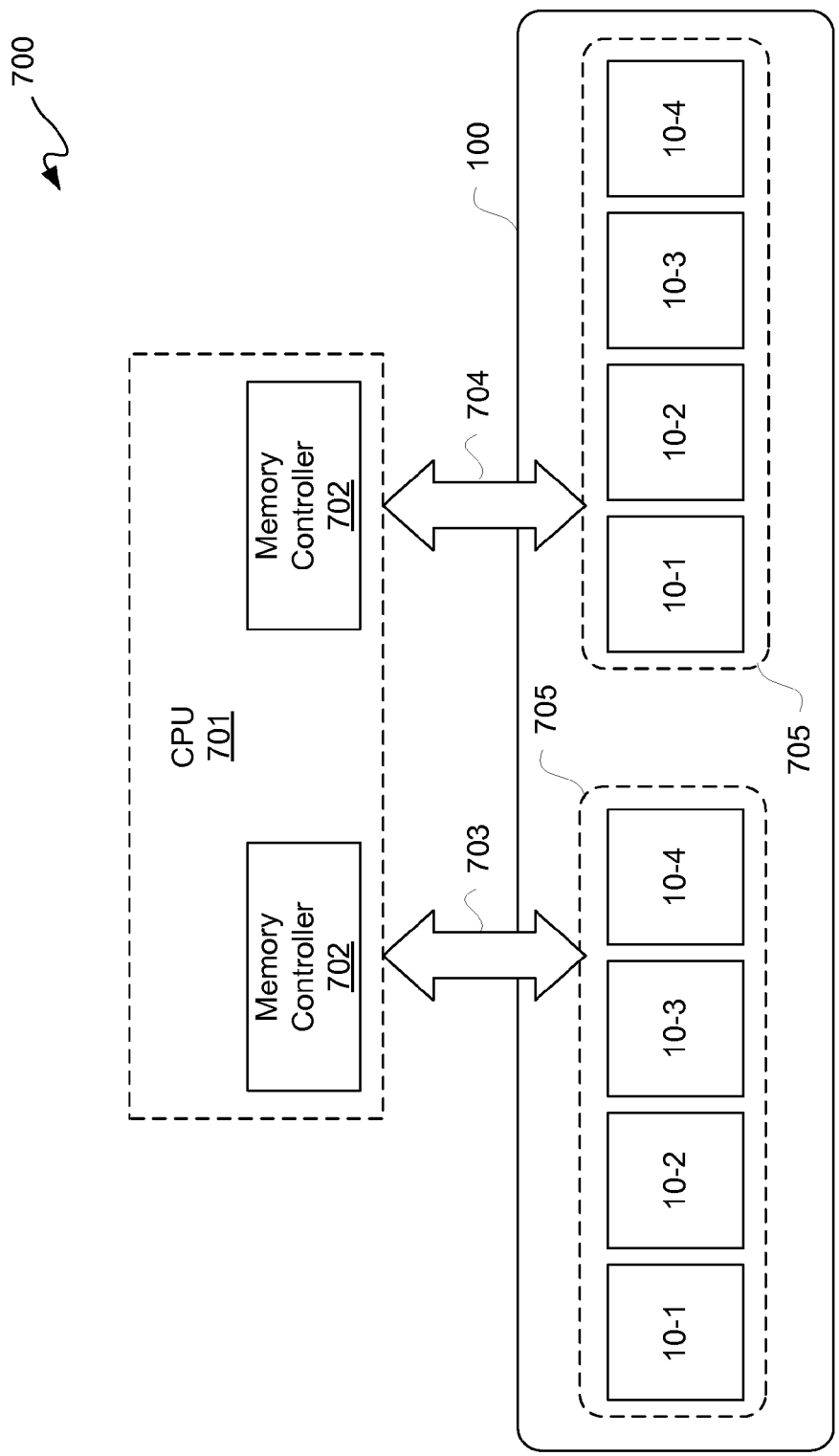
Figure 8:
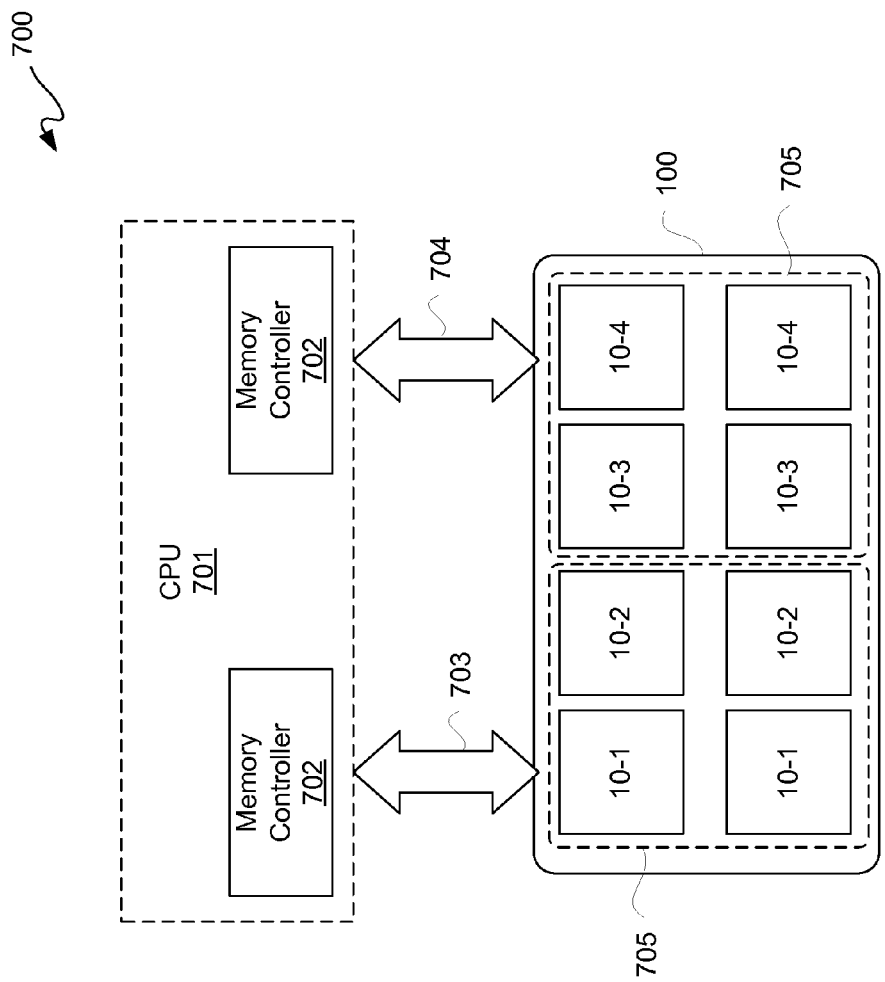

FIGS. 7 and 8 are respective block diagrams depicting exemplary memory package systems.

FIGS. 9-1, 9-2, and 10 are block diagrams of a top view depicting exemplary respective memory module sub-packages for a top sub-package of one or more of the microelectronic assemblies of FIGS. 2 through 6.

Figure 11:
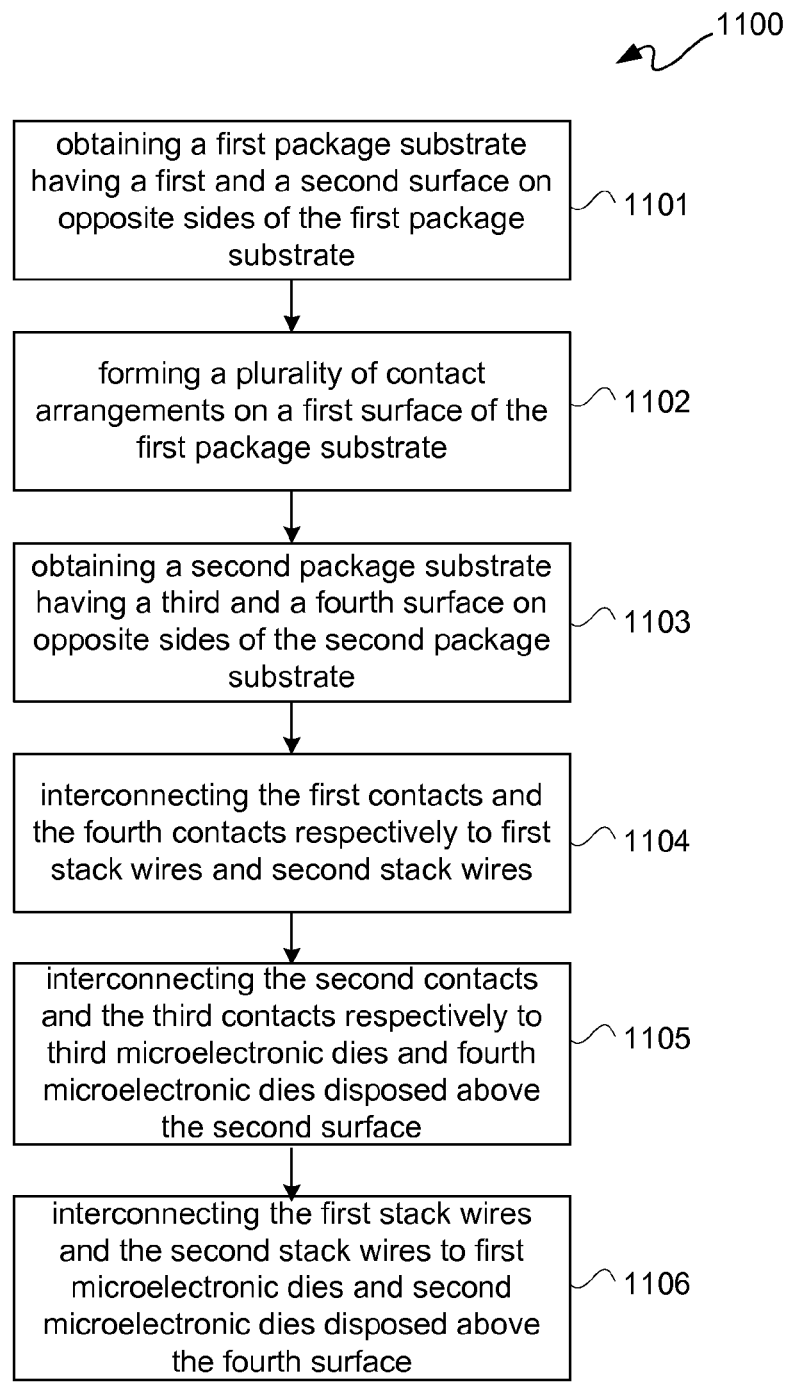

FIG. 11 is a flow diagram depicting an exemplary microelectronic assembly formation process.

Figure 12:
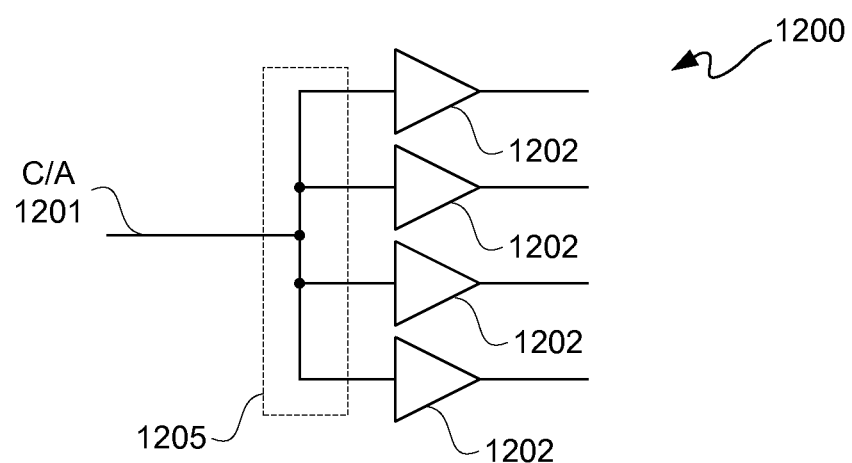

FIG. 12 is a schematic diagram depicting an exemplary signal path.

Figure 13:
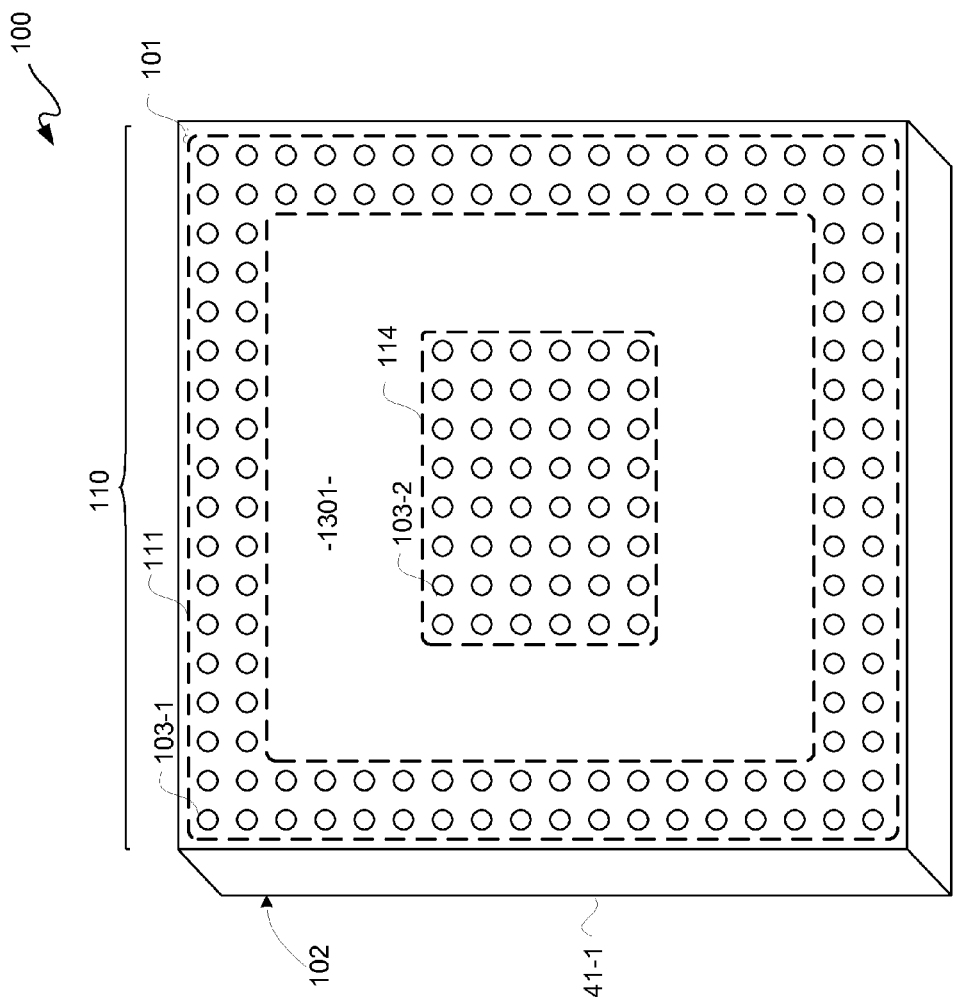

FIG. 13 is schematic diagram depicting a bottom view of yet another microelectronic assembly though for a dual rank implementation.

Figure 14:
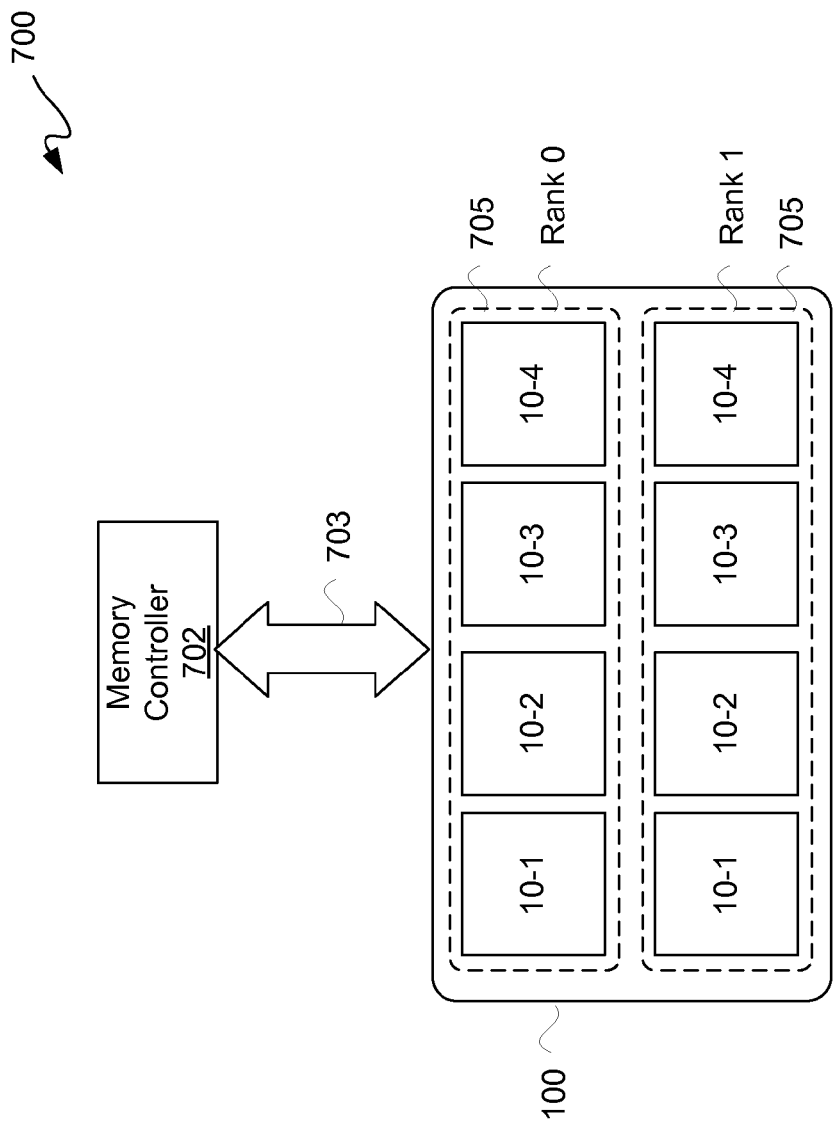
Figure 15:
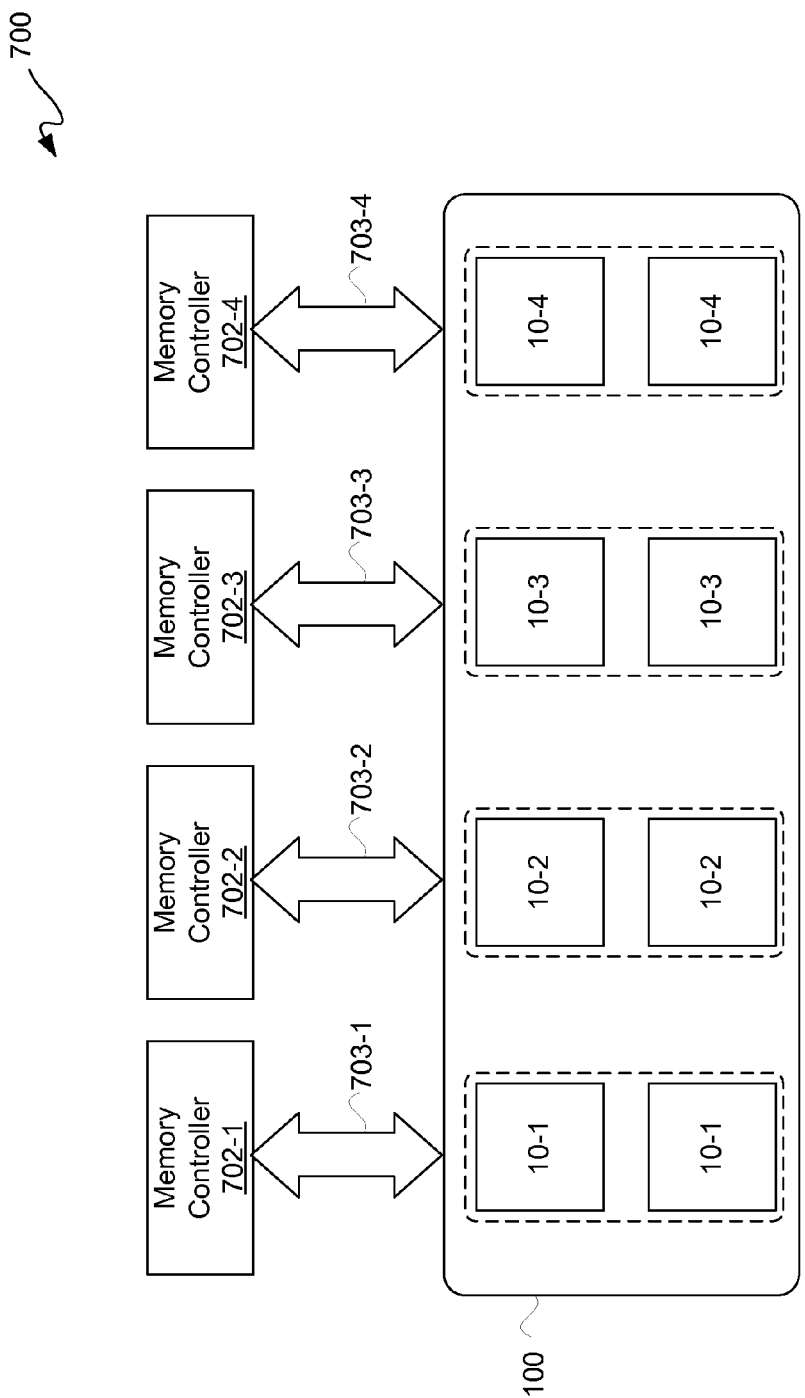

FIGS. 14 and 15 are respective block diagrams depicting other exemplary memory package systems.

Figure 16:
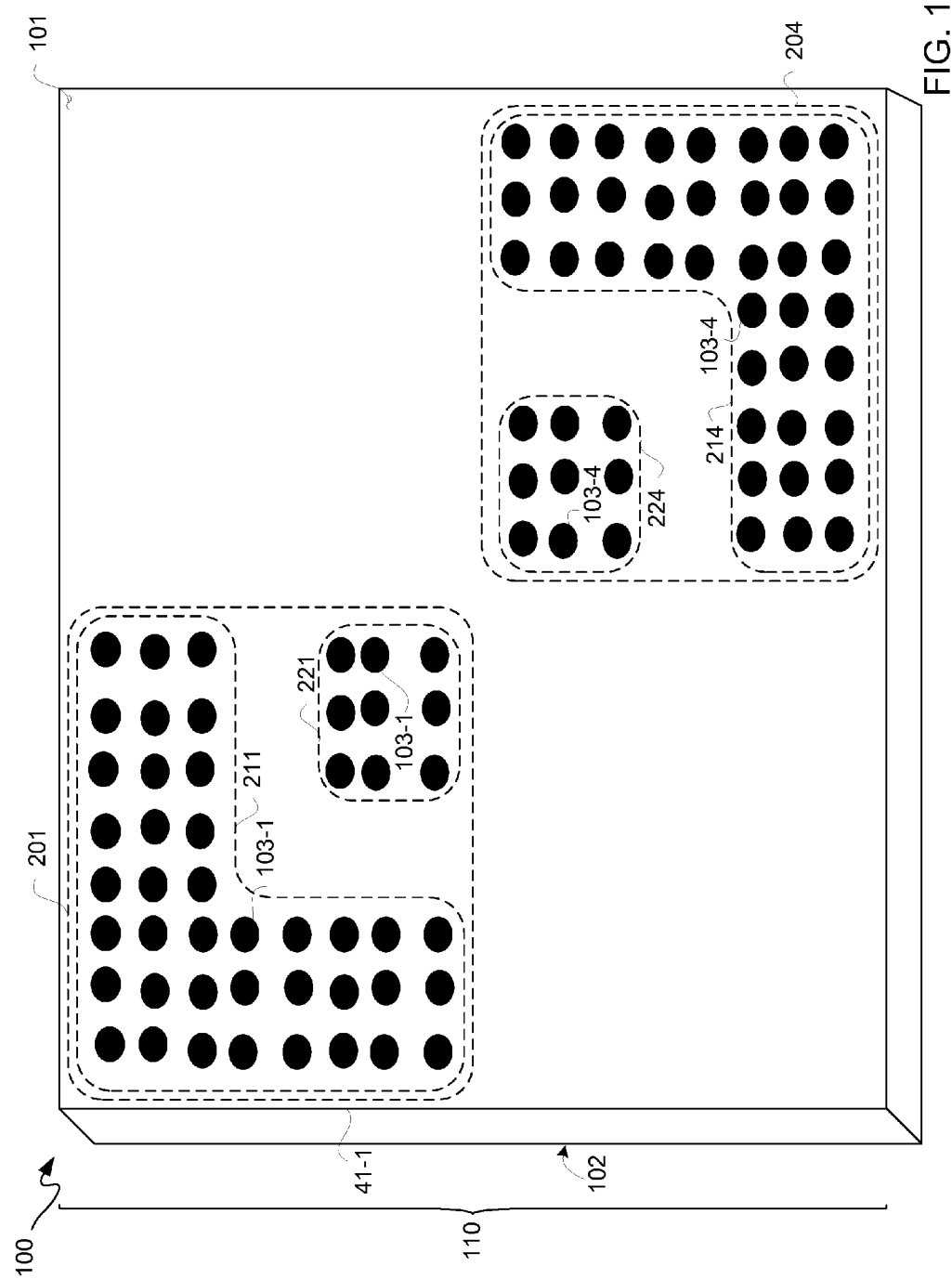

FIG. 16 is schematic diagram depicting a bottom view a still yet another microelectronic assembly.

Figure 17:
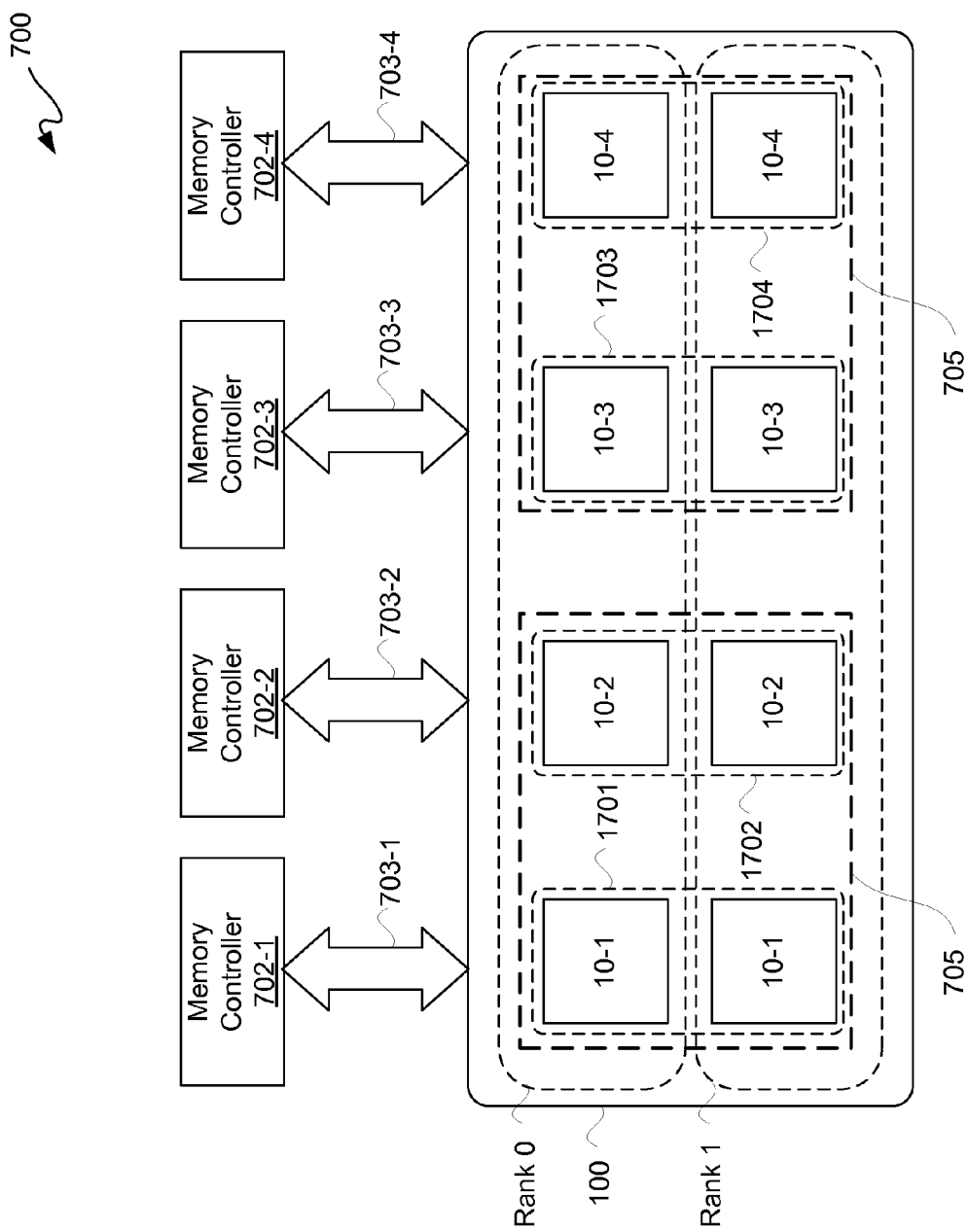

FIG. 17 is a block diagram depicting yet another exemplary memory package system.

FIGS. 18-1 and 18-2 are block diagrams depicting exemplary side cross-sectional views of another configuration of the microelectronic assembly of FIG. 16.

Figure 19:
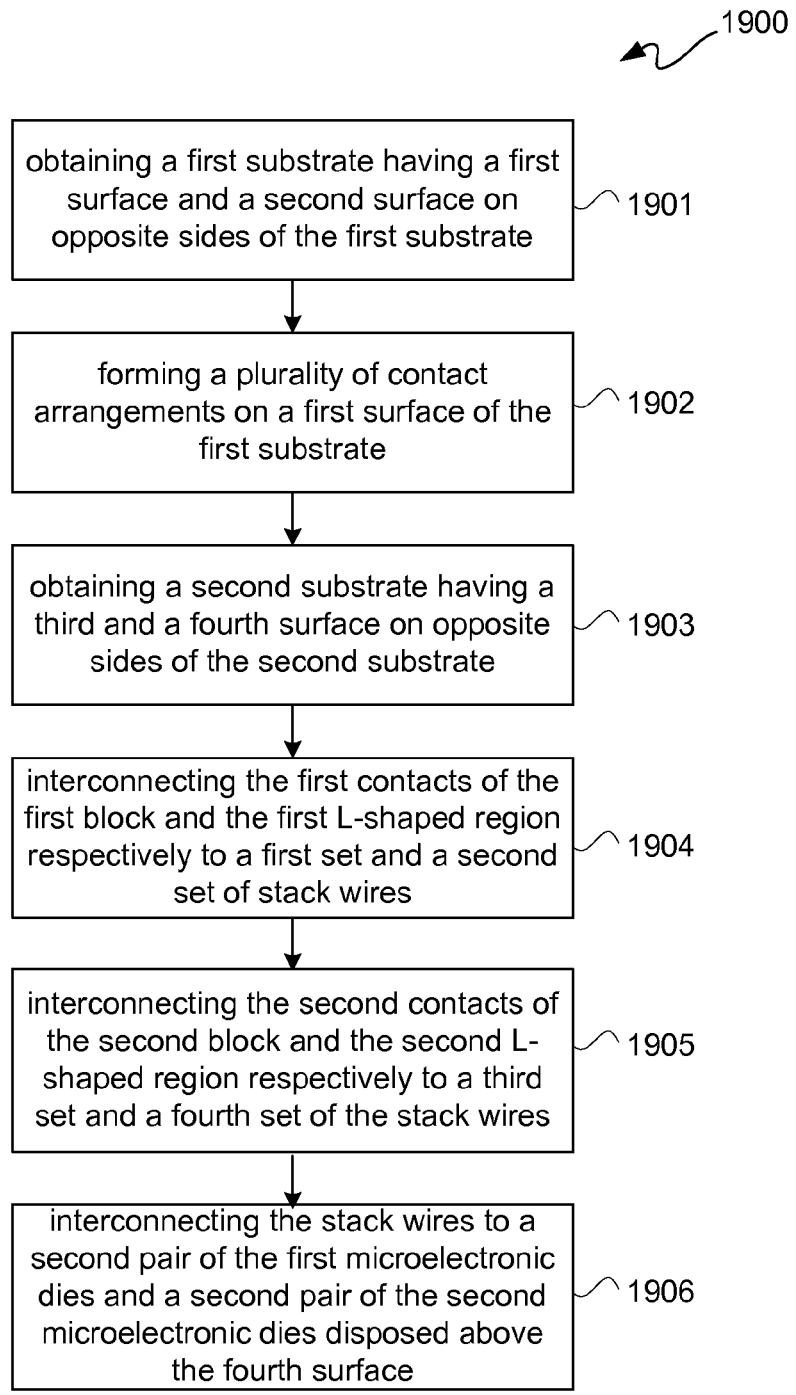

FIG. 19 is a flow diagram depicting another exemplary microelectronic assembly formation process.

Figure 20:
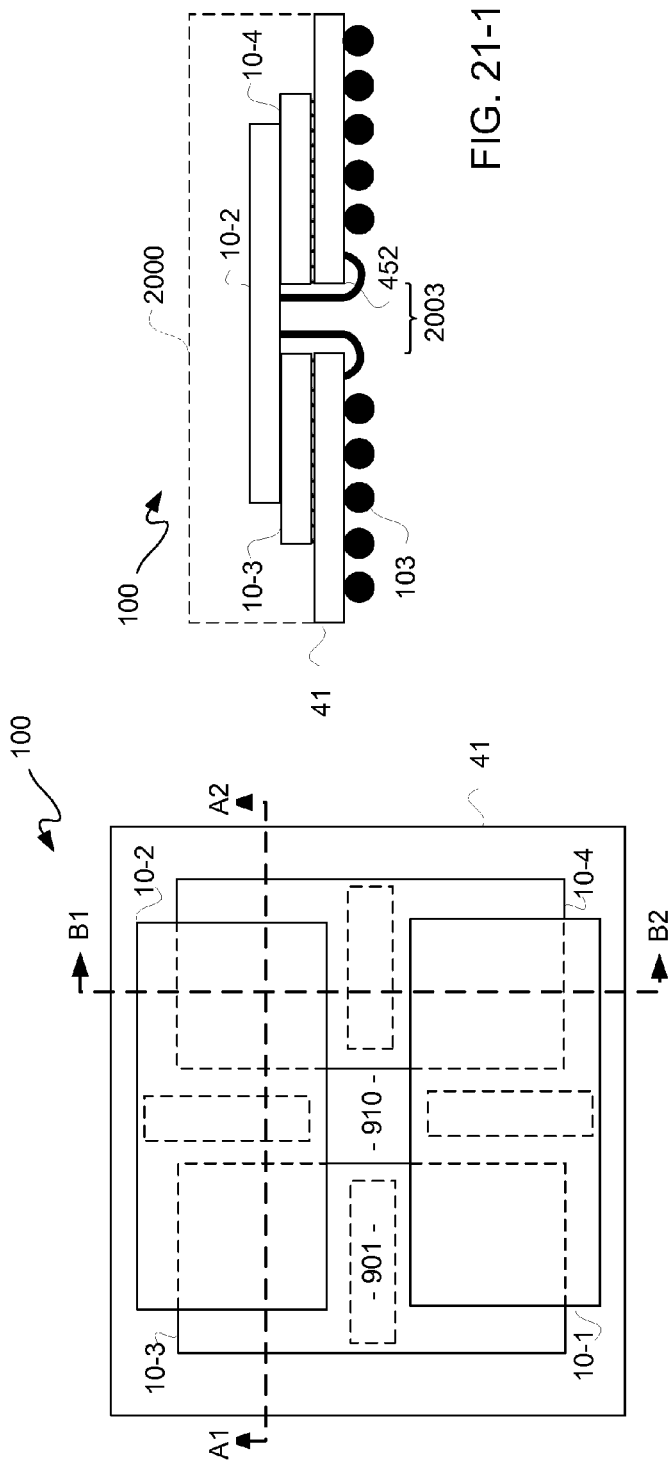

FIG. 20 is a block diagram of a top view of another implementation of a microelectronic assembly.

Figures 1, 21:
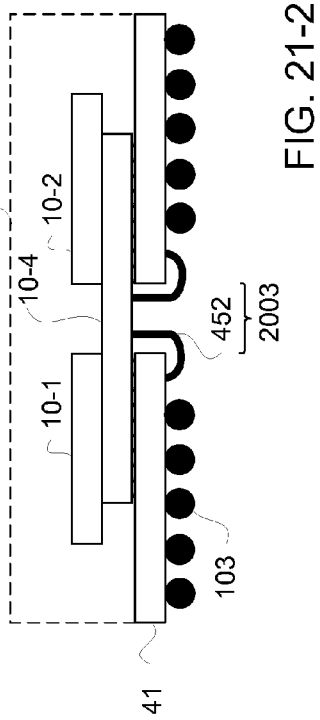
Figures 2, 21:
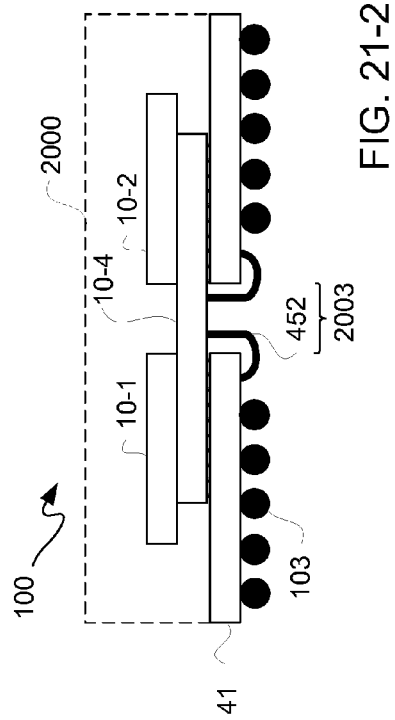

FIG. 21-1 is a block diagram of a cross-sectional view along A1-A2 of the microelectronic assembly of FIG. 20.

FIG. 21-2 is a block diagram of a cross-sectional view along B1-B2 of the microelectronic assembly of FIG. 20.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

More recently, vertical connections have been used to provide vertical stacks electronic components, such as IC die. Generally, attaching one die to another using, in part, Through Silicon Vias (TSVs), Through Mold Vias (TMVs) or other vertical connections may be performed at a bond pad level or an on-chip electrical wiring level. Integrated circuits ("ICs") may be diced from a wafer into single dies. Such single dies may be bonded to one another or bonded to a circuit platform. For purposes of clarity by way of example and not limitation, it shall be assumed that an interposer is used for such circuit platform.

Interconnection components, such as interposers, may be in electronic assemblies for a variety of purposes, including facilitating interconnection between components with different connection configurations or to provide spacing between components in a microelectronic assembly, among others. Interposers may include a semiconductor layer, such as of silicon or the like, in the form of a sheet or layer of material or other substrate having conductive elements such as conductive vias extending within openings which extend through such layer of semiconductor material. Such conductive vias may be used for signal transmission through such interposer. In some interposers, ends of such vias may be used as contact pads for connection of such interposer to other microelectronics components.

FIG. 1-1 is a block diagram of a cross-sectional view depicting an exemplary 3D IC packaged component 50 with via structures 18. While a stacked die or a package-on-package die may include TSV interconnects, use of via structures 18 for a 3D IC packaged component 50 is described for purposes of clarity by way of example. In this example of a 3D IC packaged component 50, there are three ICs 10, namely ICs 10-1, 10-2, and 10-3, stacked one upon the other. In other implementations, there may be fewer or more than three ICs 10 in a stack. ICs 10 may be bonded to one another using microbumps 52 or flip-chip solder bumps. Optionally, Cu pillars extending from a backside of a die may be used. Some of these microbumps 52 may be interconnected to via structures 18. For example, a Cu/Sn microbump transient liquid phase ("TLP") bonding technology may be used for bonding ICs to one another. Thus, interconnect layers may be on one upper or lower side or both upper and lower sides of an IC 10 of a 3D stack.

A bottom IC 10-3 of such ICs in a 3D stack optionally may be coupled to an interposer or interposer die 40. Interposer 40 may be an active die or a passive die. For purposes of clarity and not limitation, it shall be assumed that interposer 40 is a passive die. IC 10-3 may be coupled to interposer 40 by microbumps 52. Interposer 40 may be coupled to a package substrate 41. Package substrate 41 may be formed of thin layers called laminates or laminate substrates. Laminates may be organic or inorganic. Examples of materials for "rigid" package substrates include an epoxy-based laminate such as FR4, a resin-based laminate such as bismaleimide-triazine ("BT"), a ceramic substrate, a glass substrate, or other form of package substrate. An under fill 54 for a flip chip attachment may encapsulate C4 bumps or other solder balls 53 used to couple interposer 40 and package substrate 41. A spreader/heat sink ("heat sink") 43 may be attached to package substrate 41, and such heat sink 43 and substrate package 41 in combination may encase ICs 10 and interposer 40 of such 3D stack. A thermal paste 42 may couple an upper surface of IC 10-1 on top of such 3D stack to an upper internal surface of such heat sink 43. Ball grid array ("BGA") balls or other array interconnects 44 may be used to couple package substrate 41 to a circuit platform, such as a PCB for example.

FIG. 1-2 is a block diagram of a cross-sectional view depicting another exemplary 3D IC packaged component 50 with via structures 18. 3D IC packaged components 50 of FIGS. 1-1 and 1-2 are the same except for the following differences; in FIG. 1-2, another IC 10-4 is separately coupled via microbumps 52 to interposer 40, where IC 10-4 is not coupled in the stack of ICs 10-1, 10-2, and 10-3. Furthermore, interposer 40 includes metal and via layers for providing wires 47 for interconnecting ICs 10-3 and 10-4. Furthermore, interposer 40 includes via structures 18 coupled to IC 10-4 through microbumps 52.

3D wafer-level packaging ("3D-WLP") may be used for interconnecting two or more ICs, one or more ICs to an interposer, or any combination thereof, where interconnects thereof may use via structures 18. Optionally, ICs may be interconnected die-to-die ("D2D") or chip-to-chip ("C2C"), where interconnects thereof may use via structures 18. Further, optionally, ICs may be interconnected die-to-wafer ("D2W") or chip-to-wafer ("C2W"), where interconnects thereof may use via structures 18. Accordingly, any of a variety of die stacking or chip stacking approaches may be used to provide a 3D stacked IC ("3D-SIC" or "3D-IC").

FIG. 2 is schematic diagram depicting a bottom view a microelectronic assembly 100. A package substrate 41-1 has a lower surface 101 and an upper surface 102 on opposite sides of package substrate 41-1. A plurality of contact arrangements 110 may be disposed on surface 101 of package substrate 41-1.

Contact arrangements 110 include an array of contacts 103-1 disposed as an outermost or first ring array 111 of contact arrangements 110 on surface 101 of lower package substrate 41-1. Contact arrangements 110 include an array of contacts 103-2 disposed interior to an array of contacts 103-1 as another or second ring array 112 of contact arrangements 110 on surface 101. Contact arrangements 110 include an array of contacts 103-3 disposed interior to an array of contacts 103-2 as another or third ring array 113 of contact arrangements 110 on surface 101. Contact arrangements 110 include an array of contacts 103-4 disposed interior to an array of contacts 103-3 as another or innermost array 114 of contact arrangements 110 on surface 101. First ring array 111, second ring array 112, and third ring array 113 may be concentric rings with innermost array 114 and a central region 115 of such concentric rings.

Even though two rows are illustratively depicted for each array of rings 111 through 113, each array of rings 111 through 113, as well as innermost array 114, may include one or more ring rows of contacts. Furthermore, arrays of rings 111 through 113, as well as innermost array 114, may have a same number or different numbers of rows or contacts thereof.

FIG. 3 is schematic diagram depicting a cross-sectional view of a microelectronic assembly 100 using stack wires. In other configurations as described below in additional detail, upper or lower wire bonds and flip-chip microbumps may be used. Moreover, a combination of two or more of stack wires, upper or lower wire bonds, and/or flip-chip microbumps may be used in another configuration. Effectively, microelectronic assembly 100 includes a first module 190-1 stacked on a second module 190-2. Each of modules 190 may include four memory dies 10, and so microelectronic assembly 100 may include a total of eight memory dies 10. Upper or first module 190-1 may be a completed module when stacked onto module 190-2.

A first package substrate 41-1 has a lower surface 101 and an upper surface 102 on opposite sides of package substrate 41-1. A plurality of contact arrangements 110 may be disposed on surface 101 of package substrate 41-1.

A second package substrate 41-2 has a third or lower surface 141 and a fourth or upper surface 142 on opposite sides of package substrate 41-2. Contacts 103-1 and contacts 103-4 may be respectively interconnected to interconnection components, such as wires, solder masses, and/or posts for example. For purposes of clarity and not limitation, such interconnection components are referred to herein as stack wires 151 and stack wires 152, which may be same types of wires but interconnected to different sets of contacts, and which may be used for carrying different types of signals, as described below in additional detail. Contacts 103-1 and contacts 103-4 may be for interconnection with sets of microelectronic dies, generally represented as microelectronic dies 10-1 and microelectronic dies 10-2. Another microelectronic die 10-1, as described below in additional detail, does not appear in this FIG. 3.

Stack wires 151 and stack wires 152 extend from second surface 102 of package substrate 41-1 to third surface 141 of package substrate 41-2. Contacts 103-1 and contacts 103-4 may correspond to stack wires 151 and stack wires 152, as a contact may go to multiple stack wires. Accordingly, as described herein, contacts may be interconnected to one or more stack wires through one or more associated traces and/or vias 150 in a package substrate.

Second surface 102 and third surface 141 define an interior region 140 therebetween for microelectronic dies 10-3 and microelectronic dies 10-4. Another microelectronic die 10-4, as described below in additional detail, does not appear in this FIG. 3. Stack wires 151 and stack wires 152 are for interconnection with microelectronic dies 10-1 and 10-2 disposed above a fourth surface 142 of package substrate 41-2.

Contacts 103-2 and contacts 103-3 are respectively interconnected to stack wires 153 and stack wires 154. Contacts 103-2 and contacts 103-3 may correspond to stack wires 153 and stack wires 154, and accordingly may be interconnected through one or more associated traces and/or vias 150 in package substrate 41-1. Stack wires 153 and stack wires 154 extend from second surface 102 of package substrate 41-1 toward third surface 141 of package substrate 41-2 in interior region 140 between second surface 102 and third surface 141 for direct interconnection with microelectronic dies 10-3 and 10-4 in interior region 140. Contacts 103-2 and contacts 103-3 may be for interconnection with sets of microelectronic dies, generally represented as microelectronic dies 10-3 and 10-4. There may be another microelectronic die 10-4, as described below in additional detail.

Additionally, stack wires 161 may extend from fourth surface 142 of package substrate 41-2 for direct interconnection with microelectronic dies 10-1 and 10-2. Stack wires 161 may correspond to stack wires 151, and accordingly may be interconnected through one or more associated traces and/or vias 150 in package substrate 41-2. Likewise, stack wires 162 may extend from fourth surface 142 of package substrate 41-2 for direct interconnection with microelectronic dies 10-1 and 10-2. Stack wires 162 may correspond to stack wires 152, and accordingly may be interconnected through one or more associated traces and/or vias 150 in package substrate 41-2.

Stack wires 151 through 154 may be respective "free standing" wire bond wires, such as bond via array or BVA™ wires. Likewise, stack wires 161 and 162 may be "free standing" wire bond wires, pins, microbumps, solder masses, pillars, or other suitable extending conductive structure.

Third contacts 103-3 are control and address signal contacts for microelectronic dies 10-3 and 10-4. Fourth contacts 103-4 are control and address signal contacts for microelectronic dies 10-1 and 10-2. First contacts 103-1 are data signal contacts for microelectronic dies 10-1 and 10-2. Second contacts 103-2 are data signal contacts for microelectronic dies 10-3 and 10-4.

In an implementation, microelectronic dies 10-1 and 10-2 may be first memory dies 10-1 and second memory dies 10-2, respectively, spaced apart from one another with each of memory dies 10-1 in a latitudinal orientation and each of memory dies 10-2 in a longitudinal orientation, as described below in additional detail. In such an implementation, microelectronic dies 10-3 and 10-4 may be third memory dies 10-3 and fourth memory dies 10-4, respectively, spaced apart from one another with each of third memory dies 10-3 in a latitudinal orientation and each of memory dies 10-4 in a longitudinal orientation, as described below in additional detail.

As described below in additional detail, in such an implementation, memory dies 10-1 and 10-2, as well as memory dies 10-3 and 10-4, may form a quadrilateral-like formation from a top-down or bottom-up perspective defining a central region with respect to such memory dies quadrilateral-like formation. Along those lines, microelectronic dies 10-1 and 10-2 may be of a first sub-package or module 190-1, and microelectronic dies 10-3 and 10-4 may be a second sub-package or module 190-2. Such first and second sub-packages may be for a memory module. Such first and second sub-packages may be respectively coupled to a first channel and a second channel. In another implementation, such first and second sub-packages may be respectively coupled to a first rank and a second rank sharing a common channel.

In the above example, package substrates 41-1 and 41-2 may be formed of an organic material. However, in another configuration package substrates 41-1 and 41-2 may be formed of an inorganic material, such as a semiconductor, such as silicon or the like, glass, or other suitable material as is well known in the art of package substrates.

To recapitulate, first contacts 103-1 may be for data signals ("DQs") of two microelectronic dies 10-1 and two microelectronic dies 10-2 coupled to a package substrate 41-2 of a top sub-package, and fourth contacts 103-4 may be for control and address signals ("C/As") of such two microelectronic dies 10-1 and such two microelectronic dies 10-2 coupled to package substrate 41-2 of such a top sub-package. Second contacts 103-2 may be for DQs of two microelectronic dies 10-3 and two microelectronic dies 10-4 coupled to a package substrate 41-1 of a bottom sub-package, and third contacts 103-3 may be for control and address signals ("C/As") of such two microelectronic dies 10-3 and such two microelectronic dies 10-4 coupled to package substrate 41-1 of such a bottom sub-package. Of course, these configurations are only examples, and other configurations in accordance with the description herein may be used in other implementations. C/A and DQ signals may be assigned inversely to the configuration described above or may have any suitable configuration.

Figures 1, 4:
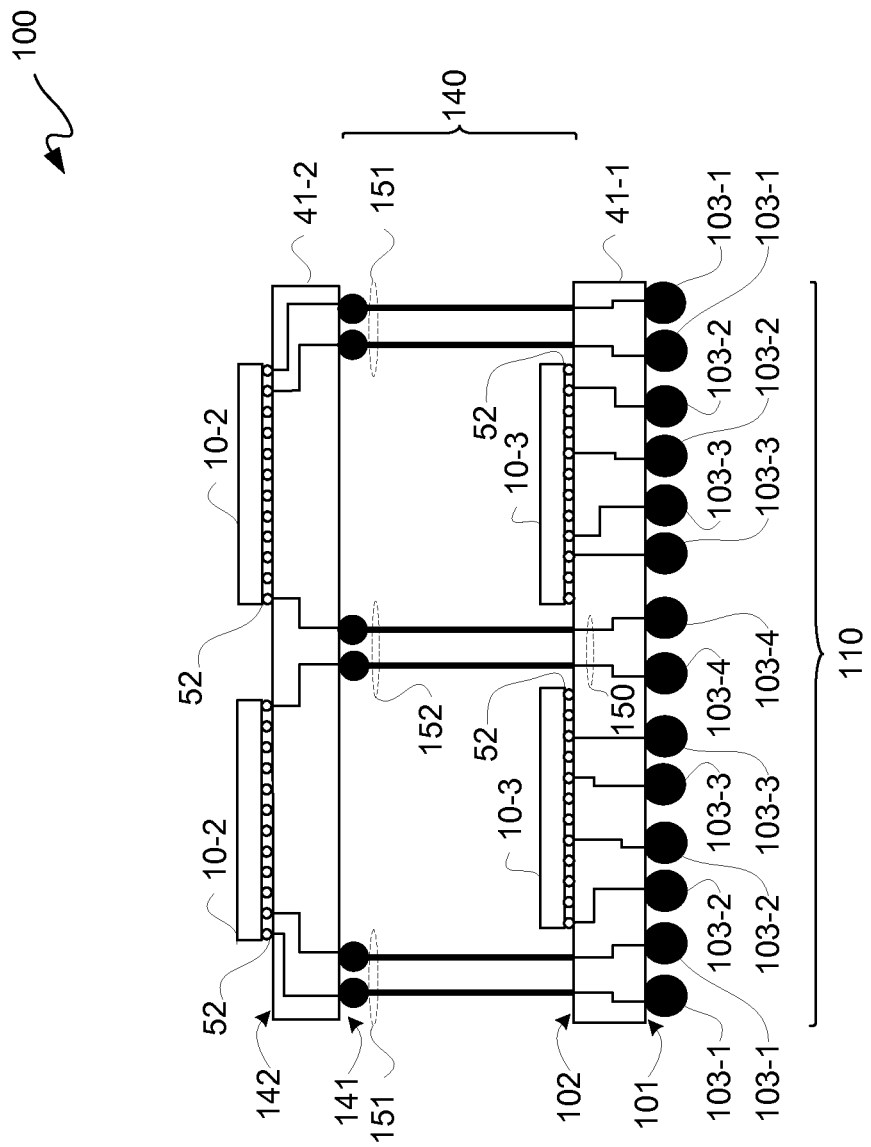
Figures 2, 4:
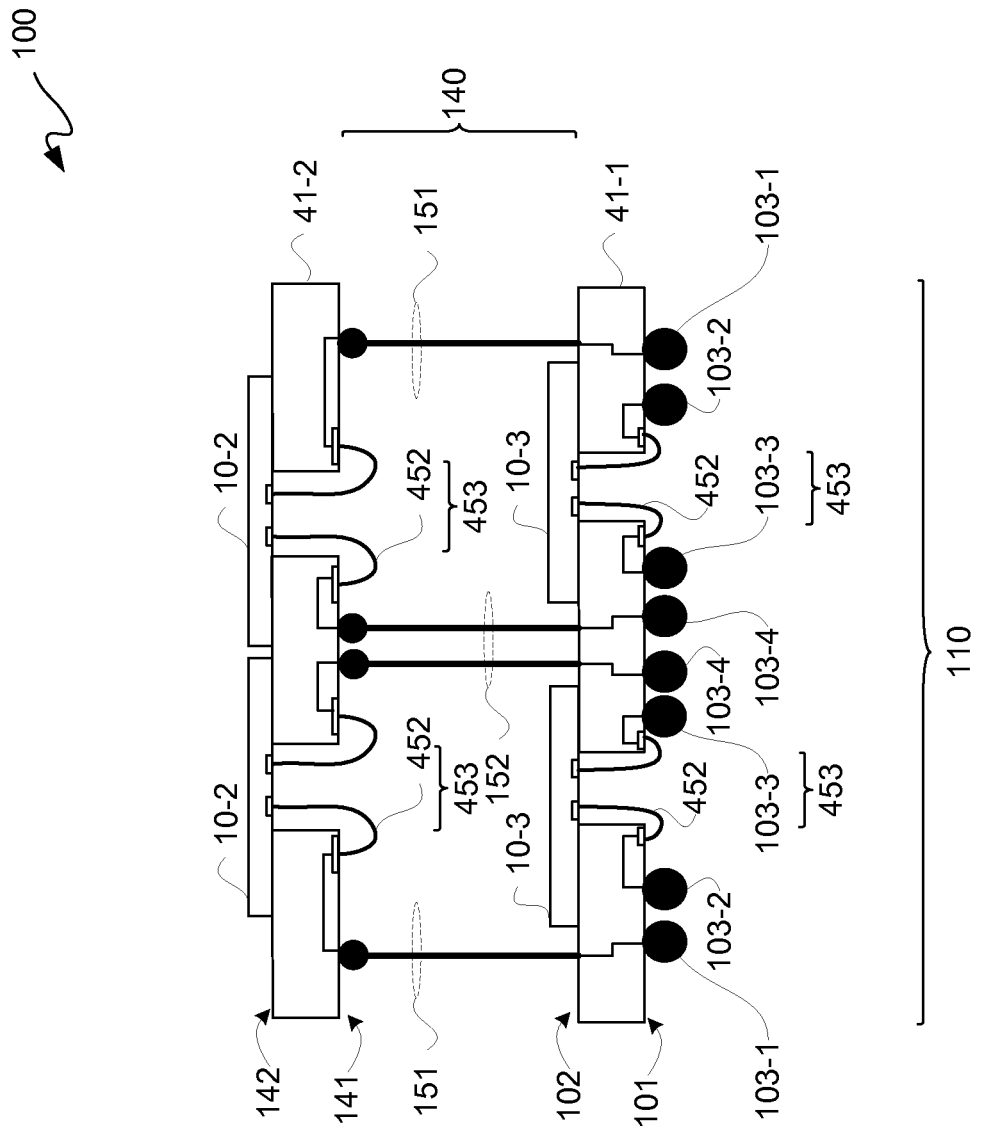
Figures 3, 4:
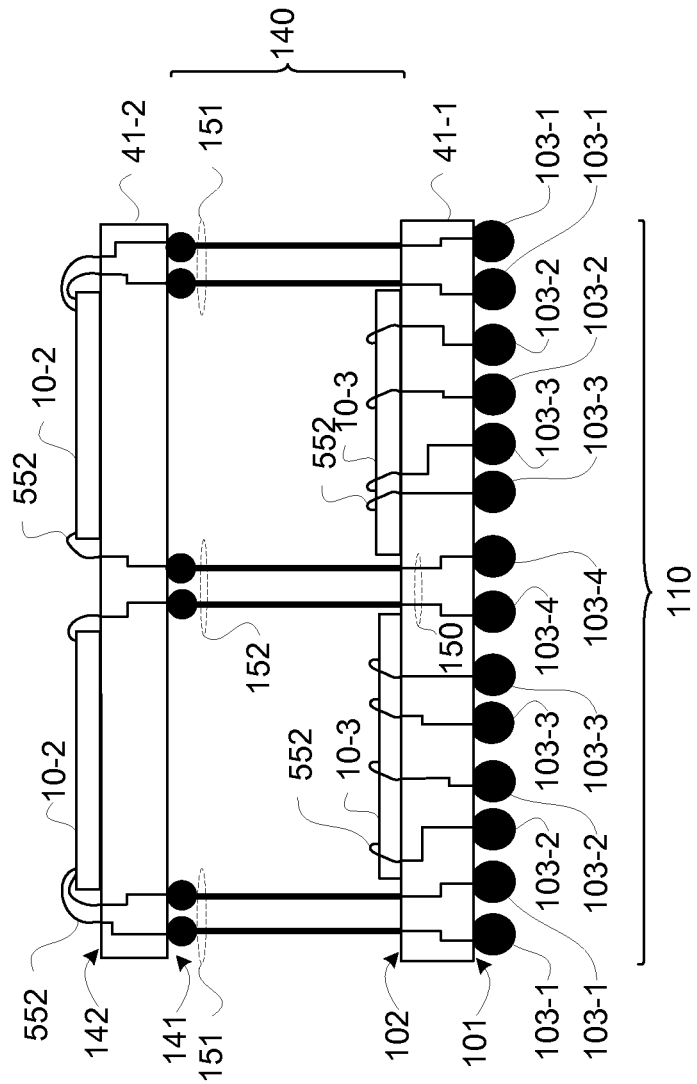

FIGS. 4-1 through 4-3 are respective schematic diagrams depicting corresponding cross-sectional views of various other implementations of microelectronic assemblies 100 using conductive mediums for die interconnects other than stack wires. While microelectronic dies 10-1 and 10-4 are not illustratively depicted in the cross-sectional side views of FIGS. 4-1 through 4-3, such microelectronic dies 10-1 and 10-4 may be present in such implementations of microelectronic assemblies 100, namely if the cross-sectional views of FIGS. 4-1 through 4-3 were each rotated 90 degrees. However, in other implementation, microelectronic dies 10-1 and 10-2 may be in one package, and microelectronic dies 10-3 and 10-4 be in another package. For purposes of clarity and not limitation, microelectronic dies 10-1 and 10-4 are not illustratively depicted in FIGS. 4-1 through 4-3.

Conductive medium die interconnects in FIG. 4-1 are illustratively depicted as microbumps 52, such as for a flip-chip implementation with downward facing microelectronic dies 10-2 and microelectronic dies 10-3. Accordingly, microelectronic dies 10-2 may be coupled to an upper surface 142 of package substrate 41-2 with microbumps 52, and microelectronic dies 10-3 may be coupled to an upper surface 102 of package substrate 41-1 with microbumps 52.

Conductive medium die interconnects in FIG. 4-2 are illustratively depicted as wire bonds 452, such as for a short path implementation for downward facing microelectronic dies 10-2 and microelectronic dies 10-3 with slots or windows 453 in package substrates 41-1 and 41-2. Wire bonds 452 may interconnect contacts or pads of microelectronic dies 10-3, associated or aligned with surface 102 of package substrate 41-1, to contacts or pads of package substrate 41-1 associated or aligned with surface 101 of package substrate 41-1. Likewise, other wire bonds 452 may interconnect contacts or pads of microelectronic dies 10-2, associated or aligned with surface 142 of package substrate 41-2, to contacts or pads of package substrate 41-2 associated or aligned with surface 141 of package substrate 41-2. Such wire bonds 452 may extend through windows 453. Traces and/or vias associated with package substrates 41 may couple such wire bond pads to other contacts 103 and stack wires 151 and 152, such as described elsewhere herein.

Thus, generally, wire bonds 452 are for interconnection with downward facing surfaces of microelectronic dies 10 and lower surfaces of package substrates 41.

Conductive medium die interconnects in FIG. 4-3 are illustratively depicted as wire bonds 552, such for upward facing microelectronic dies 10-2 and 10-3 without slots or windows 453 in package substrates 41-1 and 41-2. Wire bonds 552 may interconnect contacts or pads of package substrate 41-1, associated or aligned with surface 102 of package substrate 41-1, to contacts or pads of microelectronic dies 10-3 associated or aligned with an upper surface thereof. Likewise, other wire bonds 552 may interconnect contacts or pads of package substrate 41-2, associated or aligned with surface 142 of package substrate 41-2, to contacts or pads of microelectronic dies 10-2 associated or aligned with an upper surface thereof. Again, traces and/or vias associated with package substrates 41 may couple such wire bond pads to other contacts 103 and stack wires 151 and 152, such as described elsewhere herein.

Thus, generally, wire bonds 552 are for interconnection with upward facing surfaces of microelectronic dies 10 and upper surfaces of package substrates 41.

For purposes of clarity by way of example and not limitation, generally only one microelectronic assembly 100 of microelectronic assemblies 100 described herein is used as an example in the various implementations described below. However, it should be understood that such implementations are not limited to the example microelectronic assembly 100, as such implementations may employ one or more of the other microelectronic assemblies 100 or a combination of any of such microelectronic assemblies 100 as described herein.

FIG. 5 is schematic diagram depicting a bottom view a microelectronic assembly 100. A package substrate 41-1 has a lower surface 101 and an upper surface 102 on opposite sides of package substrate 41-1. A plurality of contact arrangements 110 may be disposed on surface 101 of package substrate 41-1.

Contact arrangements 110 may include first contacts 103-1 disposed as a first block 221 and a first generally L-shaped region 211 spaced apart from one another in a first quadrant 201 of contact arrangements 110 on surface 101.

Contact arrangements 110 may include second contacts 103-2 disposed as a second block 222 and a second generally L-shaped region 212 spaced apart from one another in a second quadrant 202 of contact arrangements 110 on surface 101. Contact arrangements 110 may include third contacts 103-3 disposed as a third block 223 and a third generally L-shaped region 213 spaced apart from one another in a third quadrant 203 of contact arrangements 110 on surface 101. Contact arrangements 110 may include fourth contacts 103-4 disposed as a fourth block 224 and a fourth generally L-shaped region 214 spaced apart from one another in a fourth quadrant 204 of contact arrangements 110 on surface 101. While the regions may be generally L-shaped with one or more contacts not aligned in an L-shape, the regions will generally be referred to simply as "L-shaped" regions herein for the purpose of simplicity.

First L-shaped region 211, second L-shaped region 212, third L-shaped region 213, and fourth L-shaped 214 are respective corners of a quadrilateral formed of quadrants 201 through 204. L-shaped regions 211-214 are positioned for defining a central region 220 having disposed therein first block 221, second block 222, third block 223, and fourth block 224. A ring portion of central region 220 may include an open space surrounding blocks 221 through 224. Additionally, first quadrant 201, second quadrant 202, third quadrant 203, and fourth quadrant 204 of such quadrilateral may each be spaced apart from one another to provide a longitudinal raceway 230 and a latitudinal raceway 210 cross-shaped region.

First L-shaped region 201 and fourth L-shaped region 204 are diagonally opposed to one another. Second L-shaped region 202 and third L-shaped region 203 are diagonally opposed to one another. First block 221 and fourth block 224 are diagonally opposed to one another. Second block 222 and third block 223 are diagonally opposed to one another.

Each array of L-shaped regions 201 through 204, may include one or more L-shaped rows of contacts even though three L-shaped rows are illustratively depicted for each array. Likewise, each array of blocks 221 through 224, may include one or more rows of contacts, and may be used for carrying different types of signals, as described below in additional detail.

Stack wires 151 and stack wires 152 may extend from second surface 102 of package substrate 41-1 to third surface 141 of package substrate 41-2. Second surface 102 and third surface 141 define an interior region 140 therebetween for microelectronic dies 10-3 and 10-4. Stack wires 151-1 and 152-1 and stack wires 151-2 and 152-2 are for interconnection with microelectronic dies 10-1 and 10-2. Contacts 103-1 and contacts 103-4 may correspond to stack wires 151 and 152. Such contacts 103-1, 103-4 may be interconnected to such stack wires 151, 152 through package substrate 41-1 via one or more traces and/or vias thereof. Additionally, such stack wires 151, 152 may be interconnected through package substrate 41-2 to microelectronic dies 10-1 and 10-2 via one or more traces and/or vias thereof, as well as BVAs 161 and 162. Thus, generally, stack wires 151 and stack wires 152 are for interconnection with microelectronic dies 10-1 and 10-2 disposed above a fourth surface 142 of package substrate 41-2.

Second contacts 103-2 are interconnected to a first set of third stack wires 153-1 and a first set of fourth stack wires 154-1. Third contacts 103-3 are interconnected to a second set of third stack wires 153-2 and a second set of fourth stack wires 154-2. Contacts 103-2 and contacts 103-3 may correspond to stack wires 153 and stack wires 154, and accordingly may be interconnected through one or more associated traces and/or vias in package substrate 41-1.

Stack wires 153 and stack wires 154 extend from second surface 102 of package substrate 41-1 toward third surface 141 of package substrate 41-2 in interior region 140 between second surface 102 and third surface 141 for direct interconnection with microelectronic dies 10-3 and 10-4 in interior region 140. Contacts 103-2 and contacts 103-3 may be for interconnection with microelectronic dies 10-3 and 10-4.

Again, stack wires 151 through 154 may be respective BVAs. Additionally, stack wires 161 may extend from fourth surface 142 of package substrate 41-2 for direct interconnection with microelectronic dies 10-1 and 10-2. Stack wires 161 may correspond to stack wires 151, and accordingly may be interconnected through one or more associated traces and/or vias 150 in package substrate 41-2. Likewise, stack wires 162 may extend from fourth surface 142 of package substrate 41-2 for direct interconnection with microelectronic dies 10-1 and 10-2. Stack wires 162 may correspond to stack wires 152, and accordingly may be interconnected through one or more associated traces and/or vias 150 in package substrate 41-2. Stack wires 161 and 162 may be one or more BVAs.

First contacts 103-1 of first block 221 and fourth contacts 103-4 of fourth block 224 are first control and address signal contacts for first microelectronic dies 10-1 and 10-2, respectively. Second contacts 103-2 of second block 222 and third contacts 103-3 of third block 223 are second control and address signal contacts for second microelectronic dies 10-3 and 10-4, respectively. In an implementation, first contacts 103-1 of first block 221 may be for a top sub-package C/As for DQs 0:31, and fourth contacts 103-4 of fourth block 224 may be for such a top sub-package C/As for DQs 32:63. Likewise, in such an implementation, second contacts 103-2 of second block 222 may be for a bottom sub-package C/As for DQs 0:31, and third contacts 103-3 of third block 223 may be for such a bottom sub-package C/As for DQs 32:63.

First contacts 103-1 of first L-shaped region 211 and fourth contacts 103-4 of fourth L-shaped region 214 are first data signal contacts for first microelectronic dies 10-1 and 10-2, respectively. Second contacts 103-2 of second L-shaped region 212 and third contacts 103-3 of third L-shaped region 213 are second data signal contacts for second microelectronic dies 10-3 and 10-4, respectively.

In an implementation, first contacts 103-1 of first L-shaped region 211 may be for a top sub-package DQs 0:31, and fourth contacts 103-4 of fourth L-shaped region 214 may be for such a top sub-package DQs 32:63. Likewise, in such an implementation, second contacts 103-2 of second L-shaped region 212 may be for a bottom sub-package DQs 0:31, and third contacts 103-3 of third L-shaped region 213 may be for such a bottom sub-package DQs 32:63.

Signal timing for control and address signals may be more problematic than for data signals. Accordingly, propagation delay of control and address signals may be more problematic than propagation delay of data signals. Conventionally, data signals are routed from one point to another point, namely there is generally no fanning out of data signals. However, control and address signals may be routed from one point to multiple points, and so there may be significant fanning out, as well as RC loading delay, of control and address signals. Because of this point to multi-point interconnectivity of control and address signals, such types of signals may be interconnected to a central portion of a memory die and internally routed out from there to equalize on-die propagation delay. In a conventional die stack, if such control and/or address contacts were generally in a central region of such dies of a die stack, then die external wires and/or traces emanated outwardly from such central region to a perimeter region for routing which added significant signal propagation delay of control and address signals. More recently, windows for wire bonding has been described in commonly owned U.S. Pat. No. 8,525,314, which is incorporated by reference herein in its entirety for all purposes. Even more recently, stackable microelectronic package structures with windows for wire bonding has been described in commonly owned U.S. Pat. No. 8,680,684, which is incorporated by reference herein in its entirety for all purposes. Accordingly, it should be appreciated that shortening signal path length for control and/or address signals of a memory die in a die stack may be useful for purposes of reducing delay of such signals.

In each microelectronic assembly 100 of FIGS. 3 through 6-1, microelectronic dies 10-1 through 10-4 are each downward facing die, so routing of control and/or address signals may be directed in a shortest path downward direction to shorten signal path length. Additionally, contacts for control and/or address signals are centrally positioned for purposes of reducing delay of those signals, as described below in additional detail.

FIGS. 6-2 and 6-3 are block diagrams depicting exemplary side cross-sectional views of another configuration of the microelectronic assembly of FIG. 5, though simplified for purposes of clarity and not limitation. FIG. 6-3 is effectively a cross-section 90 degrees rotated from the cross-section of FIG. 6-2. In this configuration, microelectronic dies 10-1 and 10-2 are all directly coupled to an upper surface of package substrate 41-2, such as through flip-chip microbumps for example. However, in another configuration, microelectronic dies 10-1 may be located above microelectronic dies 10-1, as generally indicated by a dashed box in FIG. 6-2. Likewise, in this configuration, microelectronic dies 10-3 and 10-4 are all directly coupled to an upper surface of package substrate 41-1, such as through flip-chip microbumps for example. However, in another configuration, microelectronic dies 10-4 may be located above microelectronic dies 10-3, as generally indicated by a dashed box in FIG. 6-2.

In the cross-sectional view in FIG. 6-2, upper microelectronic dies 10-2 may be coupled to first contacts 103-1 and fourth contacts 103-4 for data ("D") and control/address ("C/A"). Inner contacts 103-1C/A and 103-4C/A may be respectively for coupling to stack wires 152-1 and 152-2. Outer contacts 103-1D and 103-4D may be respectively for coupling to stack wires 151-1 and 151-2. Wire bonds 452-1C/A and 452-4C/A may respectively be coupled to inner stack wires 152-1 and 152-2. Wire bonds 452-1D and 452-4D may respectively be coupled to outer stack wires 151-1 and 151-2.

In the cross-sectional view in FIG. 6-2, lower microelectronic dies 10-3 may be coupled to second contacts 103-2 and third contacts 103-3 for data ("D") and control/address ("C/A"). Inner contacts 103-2C/A and 103-3C/A may be respectively for coupling to wire bonds 452-2C/A and 452-3C/A. Outer contacts 103-2D and 103-3D may be respectively for coupling to wire bonds 452-2D and 452-3D.

In the cross-sectional view in FIG. 6-3, upper microelectronic dies 10-1 may be coupled to first contacts 103-1 and fourth contacts 103-4 for data ("D") and control/address ("C/A"). Inner contacts 103-1C/A and 103-4C/A may be respectively for coupling to stack wires 152-1 and 152-2. Outer contacts 103-1D and 103-4D may be respectively for coupling to stack wires 151-1 and 151-2. Wire bonds 452-1C/A and 452-4C/A may respectively be coupled to inner stack wires 152-1 and 152-2. Wire bonds 452-1D and 452-4D may respectively be coupled to outer stack wires 151-1 and 151-2.

In the cross-sectional view in FIG. 6-3, lower microelectronic dies 10-4 may be coupled to second contacts 103-2 and third contacts 103-3 for data ("D") and control/address ("C/A"). Inner contacts 103-2C/A and 103-3C/A may be respectively for coupling to wire bonds 452-2C/A and 452-3C/A. Outer contacts 103-2D and 103-3D may be respectively for coupling to wire bonds 452-2D and 452-3D.

Along those lines, in an implementation, a pair of upper dies 10-1 and 10-2 at one corner may share data contacts 103-1D and 103-1C/A, and another pair of upper dies 10-1 and 10-2 at an opposing corner may share data contacts 103-4D and 103-4C/A. These dies 10-1 and 10-2 may be chip select selectable for selecting a set of dies to access at a time.

With renewed reference to FIG. 5, array of L-shaped region 201, as well as block 221, and array of L-shaped region 204, as well as block 224, may be for a same channel in a two channel memory configuration or separate channels in a four ("quad") channel memory configuration. Likewise, array of L-shaped region 202, as well as block 222, and array of L-shaped region 203, as well as block 223, may be for a same channel in a two channel memory configuration or separate channels in a quad channel memory configuration.

FIGS. 7 and 8 are respective block diagrams depicting exemplary memory package systems 700. A central processing unit ("CPU") 701 has a first memory controller 702 and a second memory controller 702. It should be understood that memory controllers need not be within CPU 701, as separate memory controllers 702 may be used. Accordingly, CPU 701 may not include memory controllers 702, and thus effectively may be optional with respect to a memory package system 700.

Memory controllers 702 may be coupled to memory sub-package modules 705 via communications channels 703 and 704, respectively. In this example, channels 703 and 704, as well as memory controllers 702, may each be 64-bits wide. However, other channel widths may be used, as well as other numbers of channels may be used. For example, memory dies 10 may be x4, x8, x16, x32, or some other data bit width, and the number of dies used in combination may provide a bit width other than 64. Moreover, a single rank or multiple ranks may be used in combination with a single channel or multiple channels. For example, a dual-rank single channel, quad channel single rank, dual-rank dual channel, or other combination may be used.

In FIG. 7, addressing of one memory sub-package module 705 may include one set of memory dies 10-1 through 10-4, and addressing of another memory sub-package module 705 may include another set of memory dies 10-1 through 10-4. Sub-package modules 705 may be provided in a same memory package module, which may be provided with a single microelectronic assembly 100.

In FIG. 8, addressing of one memory sub-package module 705 may include two memory dies 10-1 and two memory dies 10-2, and addressing of another memory sub-package module 705 may include two memory dies 10-3 and two memory dies 10-4. Sub-package modules 705 may be provided in a same memory package module, which may be provided with a single microelectronic assembly 100.

In these examples, each of memory dies 10-1 through 10-4 may be a 16-bit wide memory die. In this example, memory dies 10-1 through 10-4 may be LPDDR3 memory dies. However, even though DDR3L is illustratively depicted, other memory configurations may be used, including without limitation DDR3, DDR4L, and DDR4, among others.

Memory sub-package modules 705 may be provided as a single memory module package by use of a microelectronic assembly 100, such as of FIGS. 3 through 6. Contact arrangements for stackable microelectronic package structures, such as microelectronic assemblies 100, are for a 3D IC which may be coupled through a slot or socket, or directly mounted, to a printed circuit board ("PCB"), in contrast to a plurality of chips used to provide a SIMM or a DIMM mounted to a PCB and the entire assembly mounted to a slot on a motherboard or other PCB.

Figures 1, 9:
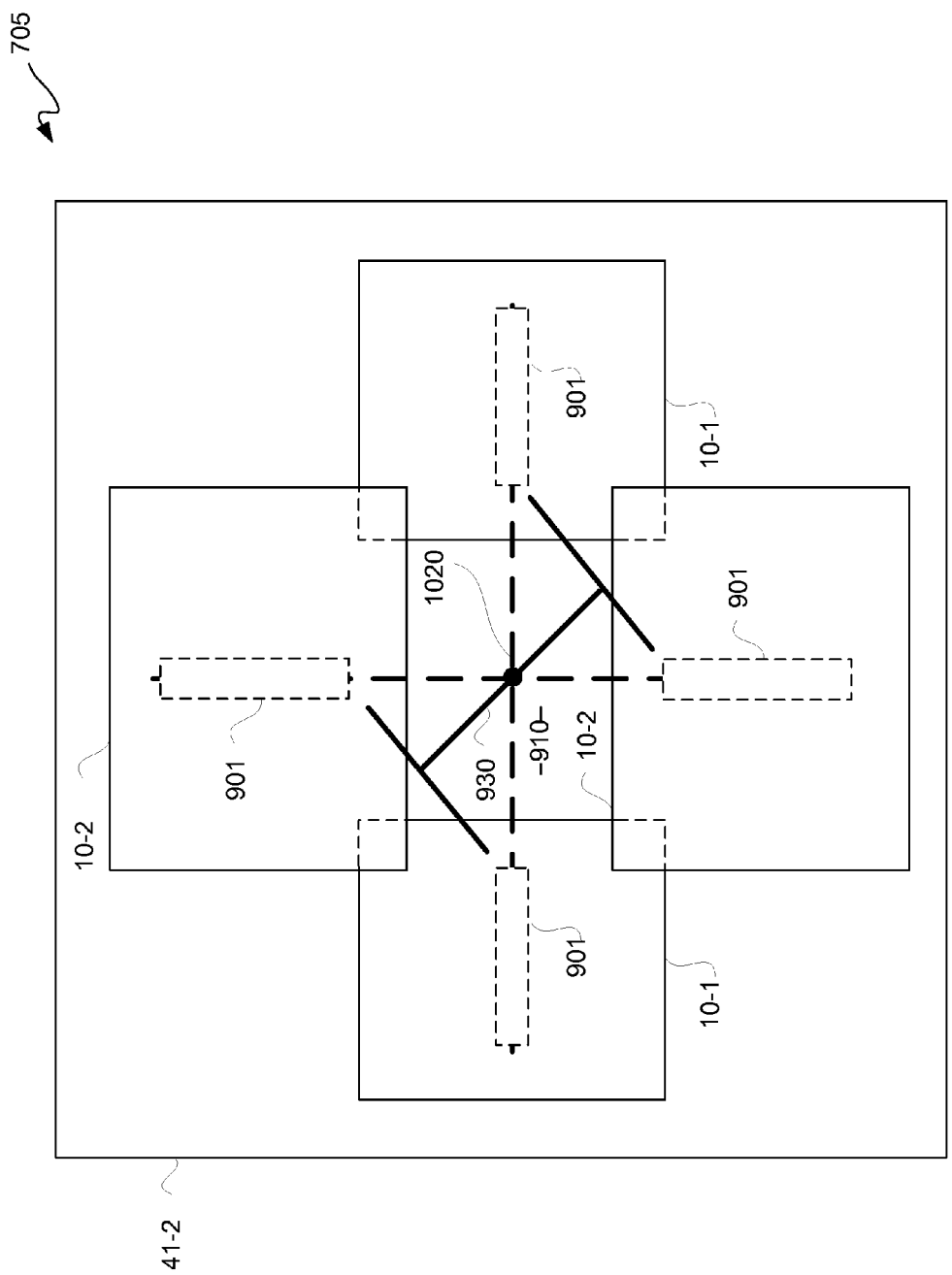
Figures 2, 9:
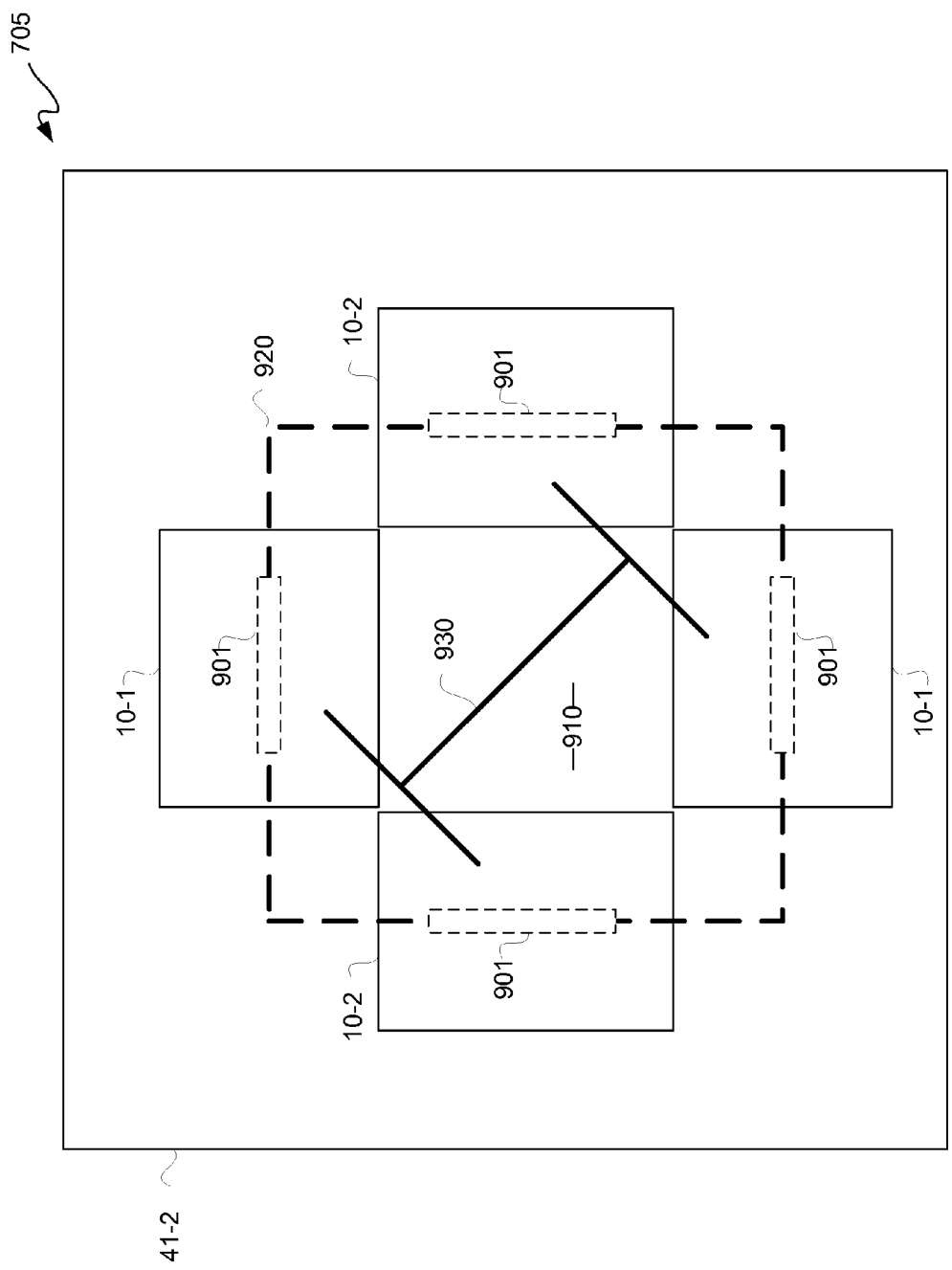
Figure 10:
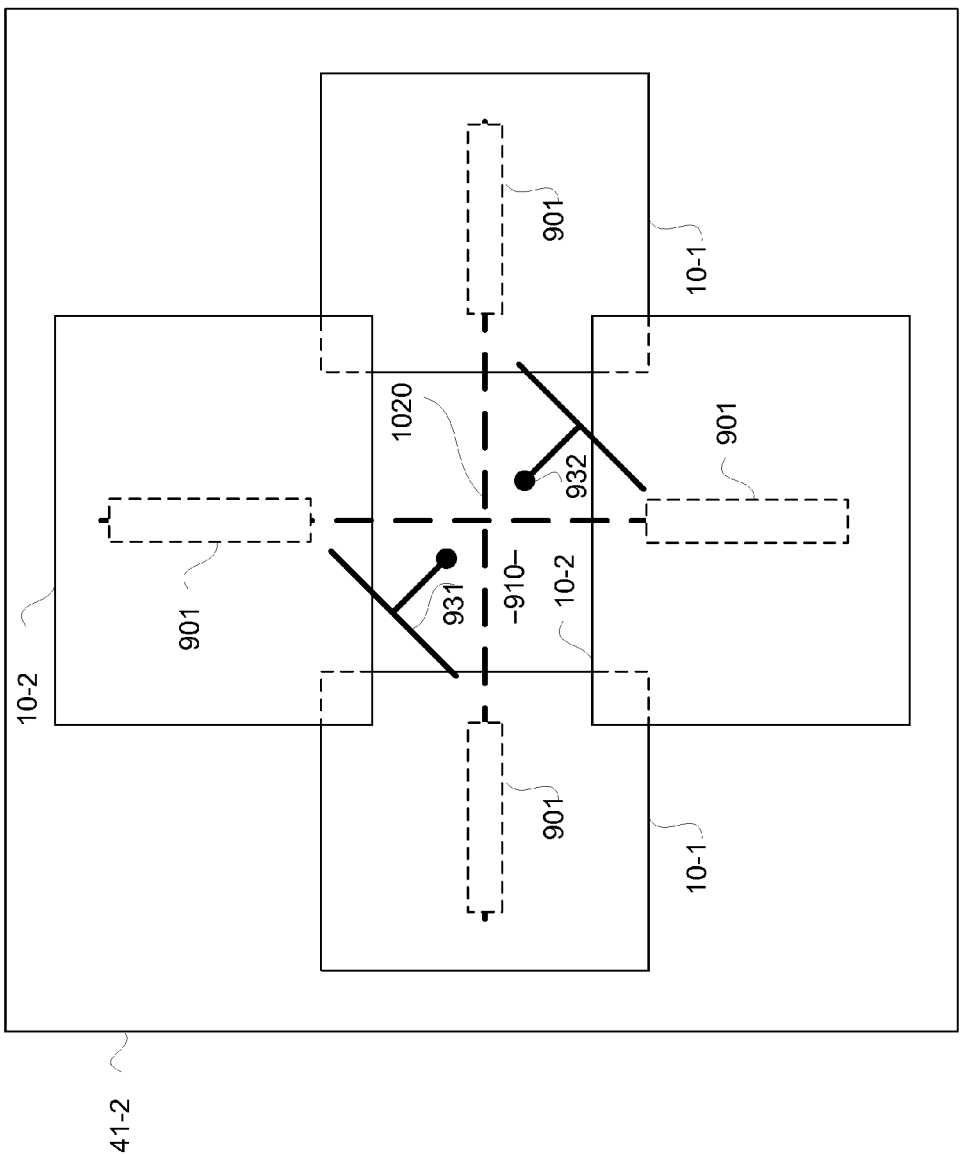

FIGS. 9-1, 9-2, and 10 are block diagrams of a top view depicting exemplary respective memory module sub-packages 705 for one or more of microelectronic assemblies 100 of FIG. 2, 3, 4-1, 4-2, 4-3, 5, 6-1, 6-2, or 6-3. In module sub-package 705 of FIG. 9, there may be a bus path 930 from a common terminal for upper and/or lower sets of dies 10 in microelectronic assembly 100, namely all four ICs 10-1 and 10-2 in this example. In module sub-package 705 of FIG. 10, there may be separate bus paths 931 and 932 from separate post terminals. Bus path 931 may interconnect to an upper left corner of ICs, namely one pair of ICs 10-1 and 10-2, and bus path 932 may interconnect to a lower right corner of ICs, namely another pair of ICs 10-1 and 10-2. In FIGS. 9 and 10, two sets of neighboring corner ICs (e.g., a north/west corner and a south/east corner) or all four dies with corner neighbors (e.g, a north/west corner and a south/east corner) interconnected off a main bus terminal may have their CA signals tied together to reduce propagation delay in comparison to coupling of opposing dies.

In each memory module sub-package 705 of FIGS. 9 and 10, first microelectronic dies, such as microelectronic dies 10-1, may be a first memory die and a second memory die spaced apart from one another with each in a first orientation, such as a longitudinal orientation for example. In each memory module sub-package 705 of FIGS. 9 and 10, second microelectronic dies, such as microelectronic dies 10-2, may be a third memory die and a fourth memory die spaced apart from one another with each in a second orientation, such as a latitudinal orientation for example, generally orthogonal to such first orientation. Corresponding sub-package modules 705 may be for microelectronic dies 10-3, as well as microelectronic dies 10-4, though not shown for purposes of clarity and not limitation.

Each of microelectronic dies 10-1 through 10-4 may include a bonding area 901. Each bonding area 901 may have a same orientation as a die in which such bonding area is defined. Microelectronic dies 10-1 through 10-4 define a central region 910 in each memory module sub-package 705 of FIGS. 9 and 10. However, for memory module sub-package 705 of FIG. 9-2, four bonding areas 901 are generally disposed as a quadrilateral-like formation 920, and for memory module sub-package 705 of FIGS. 9-1 and 10, four bonding areas 901 are generally disposed as a cross formation 1020. For some applications, quadrilateral-like formation 920 may have less propagation delay. These or other arrangements of dies 10 may be used, as described for example in U.S. Pat. No. 8,680,684 B2.

FIG. 11 is a flow diagram depicting an exemplary microelectronic assembly formation process 1100. FIG. 11 is further described with simultaneous reference to FIGS. 2 through 4-3.

At 1101, a first package substrate 41-1 may be obtained having a first surface 101 and a second surface 102 on opposite sides of first package substrate 41-1. At 1102, a plurality of contact arrangements 110 may be formed on first surface 101 of first package substrate 41-1. At 1103, a second package substrate 41-2 may be obtained having a third surface 141 and a fourth surface 142 on opposite sides of second package substrate 41-2. At 1104, first contacts 103-1 and fourth contacts 103-4 may be respectively interconnect to first stack wires 151 and second stack wires 152. At 1105, second contacts 103-2 and third contacts 103-3 may be respectively interconnected to third microelectronic dies 10-3 and fourth microelectronic dies 10-4 disposed above second surface 102. At 1106, first stack wires 151 and second stack wires 152 may be interconnected to first microelectronic dies 10-1 and second microelectronic dies 10-2 disposed above fourth surface 142.

FIG. 12 is a schematic diagram depicting an exemplary signal path 1200. A control or address signal 1201 may be provided to a C/A contact, as described herein, for microelectronic assemblies 100. Memory dies 10-1 and 10-2, or memory dies 10-3 and 10-4, may have respective input drivers 1202 for driving such signal 1201. Because such control or address signal 1201 may be bussed or fanned out to two or more memory dies of a memory module sub-package 705, there may be more RC delay. Accordingly, if bus 1205 is fanned out, then uppermost and lower most paths may have more delay.

Along those lines, returning to FIGS. 9 and 10, a memory module package provided by a microelectronic assembly 100 including pairs of each of memory dies 10-1 through 10-4, such as previously described, may have a central region 910 for a bus path to reduce propagation delay, as previously described.

With renewed reference to FIG. 5, contacts 103-1D in first L-shaped region 211 may be for a pair of x16 upper memory dies 10 to provide DQs 0:31, and contacts 103-4D in fourth L-shaped region 214 may be for another pair of x16 upper memory dies 10 to provide DQs 32:63, to collectively provide x64 memory data interface for a first channel CH0. Likewise, contacts 103-2D in second L-shaped region 212 may be for a pair of x16 lower memory dies 10 to provide DQs 0:31, and contacts 103-3D in third L-shaped region 213 may be for another pair of x16 lower memory dies 10 to provide DQs 32:63, to collectively provide x64 memory data interface for a second channel CH1. Along those lines, contacts 103-1C/A in first block 221 may be for a pair of x16 upper memory dies 10 to provide C/As for DQs 0:31, and contacts 103-4C/A in fourth block 224 may be for another pair of x16 upper memory dies 10 to provide C/As for DQs 32:63, to collectively provide x64 memory data interface for such a first channel CH0. Likewise, contacts 103-2C/A in second block 222 may be for a pair of x16 lower memory dies 10 to provide C/As for DQs 0:31, and contacts 103-3C/A in third block 223 may be for another pair of x16 lower memory dies 10 to provide C/As for DQs 32:63, to collectively provide x64 memory data interface for such a second channel CH1. This two channel configuration for a memory module, assumes a single rank and two channels. However, there may be more than one rank, and/or there may be more than two channels.

For a single rank four-channel configuration, with continued reference to FIG. 5, contacts 103-1D in first L-shaped region 211 may be for a pair of x16 upper memory dies 10 to provide DQs 0:31 for a first channel CH0, and contacts 103-4D in fourth L-shaped region 214 may be for another pair of x16 upper memory dies 10 to provide DQs 0:31 for a second channel CH1. Such upper sets of memory dies 10 may collectively provide a x64 memory data interface with 32-bits on such a first channel CH0 and another 32-bits on such a second channel CH1. Likewise, contacts 103-2D in second L-shaped region 212 may be for a pair of x16 lower memory dies 10 to provide DQs 0:31 for a third channel CH2, and contacts 103-3D in third L-shaped region 213 may be for another pair of x16 lower memory dies 10 to provide DQs 0:31 for a fourth channel CH3. Such lower sets of memory dies may likewise collectively provide a x64 memory data interface with 32-bits on such a third channel CH2 and another 32-bits on such a fourth channel CH3. Along those lines, contacts 103-1C/A in first block 221 may be for a pair of x16 upper memory dies 10 to provide C/As for DQs 0:31 of CH0, and contacts 103-4C/A in fourth block 224 may be for another pair of x16 upper memory dies 10 to provide C/As for DQs 0:31 of CH1. Likewise, contacts 103-2C/A in second block 222 may be for a pair of x16 lower memory dies 10 to provide C/As for DQs 0:31 of CH2, and contacts 103-3C/A in third block 223 may be for another pair of x16 lower memory dies 10 to provide C/As for DQs 0:31 of CH3.

However, if more than one rank of memory dies is used, mutually exclusive operation of sets of memory dies may be used to share lines for DQs and C/As. Along those lines, FIG. 13 is schematic diagram depicting a bottom view of a microelectronic assembly 100 for a dual rank implementation.

With reference to FIG. 13, a package substrate 41-1 has a lower surface 101 and an upper surface 102 on opposite sides of package substrate 41-1. A plurality of contact arrangements 110 may be disposed on surface 101 of package substrate 41-1.

Contact arrangements 110 include an array of contacts 103-1 disposed as an outermost ring array 111 of contact arrangements 110 on surface 101 of lower package substrate 41-1. Contact arrangements 110 include an array of contacts 103-2 disposed interior to outermost ring array 111 of contacts 103-1 as an innermost array 114 of contact arrangements 110 on surface 101.

Even though numbers of rows and/or columns are illustratively depicted for outermost ring array 111, as well as innermost array 114, these or other numbers may be used as may vary from implementation to implementation. Furthermore, arrays 111 and 114 may have a same number or different numbers of rows and/or columns of contacts thereof. Arrays 111 and 114 may be spaced apart from one another defining a spacing ring region 1301 around array 114 and interior to array 111.

For multiple ranks, first contacts 103-1 and second contacts 103-2 may be for interconnection to both sets of upper microelectronic dies, such as a pair of microelectronic dies 10-1 and a pair of microelectronic dies 10-2, as well as interconnect to both sets of lower microelectronic dies, such as a pair of microelectronic dies 10-3 and a pair of microelectronic dies 10-4. Thus, first contacts 103-1 and second contacts 103-2 may be for interconnection with sets of microelectronic dies 10-1, 10-2, 10-3, and 10-4 all in a same package of microelectronic assembly or module 100. In this example, upper sets of microelectronic dies 10-1 and 10-2 may be for a first rank, and lower sets of microelectronic dies 10-3 and 10-4 may be for a second rank, and both first and second rank dies may be for a single channel. However, in another implementation more than one rank and more than one channel may be implemented.

FIGS. 14 and 15 are respective block diagrams depicting exemplary memory package systems 700. With reference to FIG. 14, a memory controller 702 may be coupled to memory sub-package modules 705 of a microelectronic assembly 100 via a communications channels 703. In this example, channel 703, as well as memory controller 702, may each be 64-bits wide. However, other channel widths may be used, as well as other numbers of channels may be used. For example, memory dies 10 may be x4, x8, x16, x32, or some other data bit width, and the number of dies used in combination may provide a bit width other than 64.

In FIG. 14, addressing of one memory sub-package module 705 may include one set of memory dies 10-1 through 10-4 in a rank 0, and addressing of another memory sub-package module 705 may include another set of memory dies 10-1 through 10-4 in a rank 1. Sub-package modules 705 may be provided in a same memory package module, which may be provided with a single microelectronic assembly 100.

In FIG. 15, there are four memory controllers 702-1 through 702-4 respectively coupled via four memory communication channels 703-1 through 703-4. Memory communication channels 703-1 through 703-4 may be coupled to a single microelectronic assembly or module 100.

Pairs of memory dies 10-1, pairs of memory dies 10-2, pairs of memory dies 10-3, and pairs of memory dies 10-4 may correspond to memory communication channels 703-1 through 703-4 for respective communication therebetween. In this example, each channel of memory communication channels 703-1 through 703-4 may be 32 data bits wide, and each memory die of memory dies 10-1 through 10-4 may be 16 data bits wide. Pairs of memory dies 10-1, pairs of memory dies 10-2, pairs of memory dies 10-3, and pairs of memory dies 10-4 may be provided in a single microelectronic assembly 100, such as in FIG. 5 for example, to provide a single 128 data bit wide high-speed memory package in a small on-board footprint.

In these examples, each of memory dies 10-1 through 10-4 may be a 16-bit wide memory die. In this example, memory dies 10-1 through 10-4 may be DDR3L memory dies. However, even though DDR3L is illustratively depicted, other memory configurations may be used, including without limitation DDR3, DDR4L, and DDR4, among others.

However, with ranking, the number of contacts in FIG. 5 may be reduced, as contacts may be shared among memory dies 10 associated with separate communications channels. Along those lines, FIG. 16 is schematic diagram depicting a bottom view a microelectronic assembly 100. A package substrate 41-1 has a lower surface 101 and an upper surface 102 on opposite sides of package substrate 41-1. A plurality of contact arrangements 110 may be disposed on surface 101 of package substrate 41-1.

Contact arrangements 110 may include first contacts 103-1 disposed as a first block 221 and a first L-shaped region 211 spaced apart from one another in a first quadrant 201 of contact arrangements 110 on surface 101. Contact arrangements 110 may include fourth contacts 103-4 disposed as a fourth block 224 and a fourth L-shaped region 214 spaced apart from one another in a fourth quadrant 204 of contact arrangements 110 on surface 101.

First L-shaped region 211 and fourth L-shaped 214 may be respective opposite corners of a quadrilateral, as previously described as formed of quadrants 201 through 204. L-shaped regions 211 and 214 may be positioned for defining a central region 220 as in FIG. 5 having disposed therein first block 221 and fourth block 224. However, in this example second quadrant 202 and third quadrant 203 may each be open spaces, and first quadrant 201 and fourth quadrant 204 of such quadrilateral may each be spaced apart including a longitudinal raceway 230 and a latitudinal raceway 210 cross-shaped region as in FIG. 5.

First L-shaped region 201 and fourth L-shaped region 204 are diagonally opposed to one another. First block 221 and fourth block 224 are diagonally opposed to one another.

Each array of L-shaped regions 201 and 204 may include one or more L-shaped rows of contacts even though three L-shaped rows are illustratively depicted for each array. Likewise, each array of blocks 221 and 224 may include one or more rows of contacts even though three rows are illustratively depicted for each array. Furthermore, arrays of L-shaped regions 201 and 204, as well as blocks 221 and 224, may have a same number or different numbers of rows or contacts thereof.

FIG. 17 is a block diagram depicting another exemplary memory package system 700. Even though four communications channels are illustratively depicted in each of FIGS. 15 and 17, it should be appreciated that a two channel configuration may be used in either or both. As memory package system 700 of FIG. 17 is similar to that of FIG. 15, generally on the differences are described below for purposes of clarity and not limitation.

Microelectronic assembly or module 100 may have contact arrangements 110 as in FIG. 16. A set of memory microelectronic dies 10-1 through 10-4 of pairs thereof may be in a rank 0, and another set of memory microelectronic dies 10-1 through 10-4 of remaining pairs thereof may be in a rank 1.

Pairs 1701 of memory dies 10-1 and pairs 1702 of memory dies 10-2 may be upper dies in a memory sub-package module 705 of a microelectronic assembly, and pairs 1703 of memory dies 10-3 and pairs 1704 of memory dies 10-4 may be lower dies in memory sub-package modules 705 of a such microelectronic assembly.

FIGS. 18-1 and 18-2 are block diagrams depicting exemplary side cross-sectional views of another configuration of microelectronic assembly 100 of FIG. 16, though simplified for purposes of clarity and not limitation. FIG. 18-1 is effectively a cross-section 90 degrees rotated from the cross-section of FIG. 18-2. FIGS. 18-1 and 18-2 are similar to FIGS. 6-2 and 6-3, and so generally description thereof is not repeated for purposes of clarity and not limitation.

In the cross-sectional view in FIG. 18-1, upper microelectronic dies 10-2 may be coupled to first contacts 103-1 and fourth contacts 103-4 for data ("D") and control/address ("C/A"). Inner contacts 103-1C/A and 103-4C/A may be respectively for coupling to stack wires 152-1 and 152-2. Outer contacts 103-1D and 103-4D may be respectively for coupling to stack wires 151-1 and 151-2. Wire bonds 452-1C/A and 452-4C/A may respectively be coupled to inner stack wires 152-1 and 152-2 through traces, RDL, or other interconnection not shown for simplicity and well understood in the packaging industry. Wire bonds 452-1D and 452-4D may respectively be coupled to outer stack wires 151-1 and 151-2.

In the cross-sectional view in FIG. 18-1, lower microelectronic dies 10-3 may be coupled to contacts 103-1 and contacts 103-4 for data ("D") and control/address ("C/A"). Inner contacts 103-1C/A and 103-4C/A may be respectively for coupling to wire bonds 452-3C/A and 452-2C/A. Outer contacts 103-1D and 103-4D may be respectively for coupling to wire bonds 452-3D and 452-2D.

In the cross-sectional view in FIG. 18-2, upper microelectronic dies 10-1 may be coupled to first contacts 103-1 and fourth contacts 103-4 for data ("D") and control/address ("C/A"). Inner contacts 103-1C/A and 103-4C/A may be respectively for coupling to stack wires 152-1 and 152-2. Outer contacts 103-1D and 103-4D may be respectively for coupling to stack wires 151-1 and 151-2. Wire bonds 452-1C/A and 452-4C/A may respectively be coupled to inner stack wires 152-1 and 152-2. Wire bonds 452-1D and 452-4D may respectively be coupled to outer stack wires 151-1 and 151-2.

In the cross-sectional view in FIG. 18-2, lower microelectronic dies 10-4 may be coupled to contacts 103-1 and contacts 103-4 for data ("D") and control/address ("C/A"). Inner contacts 103-1C/A and 103-4C/A may be respectively for coupling to wire bonds 452-3C/A and 452-2C/A. Outer contacts 103-1D and 103-4D may be respectively for coupling to wire bonds 452-3D and 452-2D.

Along those lines, in an implementation, a pair of upper dies 10-1 and 10-2 at one corner may share data contacts 103-1D and 103-1C/A, and another pair of upper dies 10-1 and 10-2 at an opposing corner may share data contacts 103-4D and 103-4C/A. These dies 10-1 and 10-2 may be chip select selectable for selecting a set of dies to access at a time. Moreover, in an implementation, a pair of lower dies 10-3 and 10-4 at one corner may share contacts data contacts 103-1D and 103-1C/A, and another pair of lower dies 10-3 and 10-4 at an opposing corner may share data contacts 103-4D and 103-4C/A. These dies 10-3 and 10-4 may be chip select selectable for selecting a set of dies to access at a time.

FIG. 19 is a flow diagram depicting an exemplary microelectronic assembly formation process 1900. FIG. 19 is further described with simultaneous reference to FIGS. 13 through 19.

At 1901, a first substrate, such as a first sub-package or a first package having a package substrate 41-1, may be obtained, such first substrate having a first surface and a second surface on opposite sides of such substrate. At 1902, a plurality of contact arrangements 110 may be formed on a first surface 101. Contact arrangements 110 may be as in FIG. 13 or FIG. 16.

At 1903, a second substrate, such as a first sub-package or a first package having a package substrate 41-2, may be obtained, such second substrate having a first surface and a second surface on opposite sides of such substrate. At 1904, contacts 103-1 of each array of L-shaped regions 201 and block 221 may be respectively coupled to a first and a second set of stack wires 151-1, 152-1. Likewise, at 1905, contacts 103-4 of each array of L-shaped regions 204 and block 224 may be respectively coupled to a third and a fourth set of stack wires 151-2, 152-2. These sets of stack wires 151 and 152 may extend from an upper surface of substrate 41-1 for interconnecting to a lower surface of substrate 41-2, as previously described herein.

Such upper and lower surfaces may define an interior region of a microelectronic assembly 100 in which may be located a first pair of a first rank of microelectronic dies 10 and a first pair of a second rank of microelectronic dies 10. For example, microelectronic dies 10-3 and 10-4 of ranks 0 and 1 in FIG. 17 may be located in such interior region.

At 1906, stack wires 151 and 152 may be interconnected to a second pair of such first rank of microelectronic dies 10 and a second pair of such second rank of microelectronic dies 10 disposed above an upper surface of substrate 41-2. For example, microelectronic dies 10-1 and 10-2 of ranks 0 and 1 in FIG. 17 may be located above an upper surface of substrate 41-2.

FIG. 20 is a block diagram of a top view of another implementation of a microelectronic assembly 100. Microelectronic assembly 100 of FIG. 20 is similar to microelectronic assemblies 100 of FIGS. 9 and 10, and so generally common description is not repeated for purposes of clarity. FIG. 21-1 is a block diagram of a cross-sectional view along A1-A2 of microelectronic assembly 100 of FIG. 20, and FIG. 21-2 is a block diagram of a cross-sectional view along B1-B2 of microelectronic assembly 100 of FIG. 20. With simultaneous reference to FIGS. 20, 21-1, and 21-2 and with the above-description of FIGS. 1 through 18-2 borne in mind, microelectronic assembly 100 of FIG. 20 is further described.

In this implementation, microelectronic assembly 100 includes an upper IC 10-1, an upper IC 10-2, a lower IC 10-3, and a lower IC 10-4. Each of ICs 10-1 through 10-4 may include a respective bonding area 901 corresponding to lower surfaces of such ICs.

Upper ICs 10-1 and 10-2 may be spaced apart from one another in a generally lengthwise parallel orientation to one another. Lower ICs 10-3 and 10-4 may likewise be spaced part from one another in a generally lengthwise parallel orientation to one another, though rotated approximately 90 degrees with respect to upper ICs 10-1 and 10-2. ICs 10-1 through 10-4 may thus generally define a quadrilateral with a central open space or region 910, where IC 10-1 over laps first corner upper surface area portions of ICs 10-3 and 10-4, and where IC 10-2 over laps second corner upper surface area portions of ICs 10-3 and 10-4. Lengthwise outside edges of upper ICs 10-1 and 10-2 may be cantilevered or overhang corresponding widthwise outside edges of each of lower ICs 10-3 and 10-4.

Lower ICs 10-3 and 10-4 may have their lower surfaces coupled to an upper surface of package substrate 41 with microbumps for example. Lower ICs 10-3 and 10-4 may also have their lower surfaces coupled to a lower surface of package substrate 41 through wire bonds 452 respectively passing through a window 2003 in package substrate 41 for coupling to bonding areas 901 of ICs 10-3 and 10-4. Window 2003 may be centered with respect to central open space or region 910. Likewise, upper ICs 10-1 and 10-2 may also have their lower surfaces coupled to a lower surface of package substrate 41 through wire bonds 452 respectively passing through window 2003 in package substrate 41 for coupling to bonding areas 901 of ICs 10-1 and 10-2. After wire bonding to ICs 10-1 through 10-4, a molding material 2000 may optionally be used to protect ICs 10-1 through 10-4. Contacts 103 may be coupled to ICs 10-1 through 10-4 as previously described herein. Accordingly, such description is not repeated for purposes of clarity.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A microelectronic assembly, comprising:
    a first substrate having a first and a second surface on opposite sides of the first substrate; and
    a plurality of contact arrangements disposed on the first surface of the first substrate;
    wherein the plurality of contact arrangements comprises:
        first contacts disposed as a first ring array of the plurality of contact arrangements on the first surface;
        second contacts disposed interior to the first contacts as a second ring array of the plurality of contact arrangements on the first surface;
        third contacts disposed interior to the second contacts as a third ring array of the plurality of contact arrangements on the first surface;
        fourth contacts disposed interior to the third contacts on the first surface as an innermost array of the plurality of contact arrangements on the first surface;
        wherein the first ring array, the second ring array, and the third ring array are concentric rings with the innermost array in a first central region of the concentric rings;
        wherein the first contacts and the fourth contacts are for interconnection with first microelectronic dies; and
        wherein the second contacts and the third contacts are for interconnection with second microelectronic dies.

2. The microelectronic assembly according to claim 1, further comprising:
    a second substrate having a third and a fourth surface on opposite sides of the second substrate;
    wherein the first contacts and the fourth contacts are respectively interconnected to first stack wires and second stack wires for interconnection with the third surface of the second substrate.

3. The microelectronic assembly according to claim 2, wherein:
    the first stack wires and the second stack wires extend from the second surface of the first substrate to the third surface of the second substrate;
    the second surface and the third surface define an interior region therebetween for the second microelectronic dies; and
    the first stack wires and the second stack wires are for interconnection with the first microelectronic dies disposed above the fourth surface.

4. The microelectronic assembly according to claim 2, wherein:
    the second contacts and the third contacts are respectively for interconnecting to the second microelectronic dies disposed above the second surface; and
    the second contacts and the third contacts are for interconnection with the second microelectronic dies in same a package as the first microelectronic dies.

5. The microelectronic assembly according to claim 3, wherein the third contacts and the fourth contacts are control and address signal contacts for the second microelectronic dies and the first microelectronic dies, respectively.

6. The microelectronic assembly according to claim 5, wherein the first contacts and the second contacts are data signal contacts for the first microelectronic dies and the second microelectronic dies, respectively.

7. The microelectronic assembly according to claim 1, wherein the first microelectronic dies include:
    a first memory die and a second memory die spaced apart from one another with each in a latitudinal orientation; and
    a third memory die and a fourth memory die spaced apart from one another with each in a longitudinal orientation;
    wherein the first memory die, the second memory die, the third memory die, and the fourth memory die of each of the first microelectronic dies define a respective second central region.

8. The microelectronic assembly according to claim 1, wherein the first microelectronic dies and the second microelectronic dies are of a memory module having a single rank and at least two channels.

9. A microelectronic assembly, comprising:
- a first substrate having a first and a second surface on opposite sides of the first substrate; and
- a plurality of contact arrangements disposed on the first surface of the first substrate;
- wherein the plurality of contact arrangements comprises:
  - first contacts disposed as a first block and a first L-shaped region spaced apart from one another in a first quadrant of the plurality of contact arrangements on the first surface;
  - second contacts disposed as a second block and a second L-shaped region spaced apart from one another in a second quadrant of the plurality of contact arrangements on the first surface;
  - third contacts disposed as a third block and a third L-shaped region spaced apart from one another in a third quadrant of the plurality of contact arrangements on the first surface; and
  - fourth contacts disposed as a fourth block and a fourth L-shaped region spaced apart from one another in a fourth quadrant of the plurality of contact arrangements on the first surface;
  - wherein the first contacts and the fourth contacts are for interconnection with first microelectronic dies; and
  - wherein the second contacts and the third contacts are for interconnection with second microelectronic dies.

10. The microelectronic assembly according to claim 9, wherein:
- the first L-shaped region, the second L-shaped region, the third L-shaped region, and the fourth L-shaped are respective corners of a quadrilateral defining a first central region having disposed therein the first block, the second block, the third block, and the fourth block;
- the first quadrant, the second quadrant, the third quadrant, and the fourth quadrant of the quadrilateral are each spaced apart from one another;
- the first L-shaped region and the fourth L-shaped region are diagonally opposed to one another;
- the second L-shaped region and the third L-shaped region are diagonally opposed to one another;
- the first block and the fourth block are diagonally opposed to one another; and
- the second block and the third block are diagonally opposed to one another.

11. The microelectronic assembly according to claim 9, further comprising:
- a second substrate having a third and a fourth surface on opposite sides of the second substrate;
- wherein:
  - the first contacts of the first block and the first L-shaped region are respectively interconnected to a first set and a second set of stack wires;
  - the fourth contacts of the fourth block and the fourth L-shaped region are respectively interconnected to a third set and a fourth set of the stack wires;
  - the stack wires extend from the second surface of the first substrate for interconnecting to the third surface of the second substrate; and
  - the second surface and the third surface define an interior region therebetween for locating the second microelectronic dies.

12. The microelectronic assembly according to claim 11, wherein the stack wires are for interconnection to the first microelectronic dies disposed above the fourth surface.

13. The microelectronic assembly according to claim 12, wherein:
- the second contacts and the third contacts are respectively interconnected to the second microelectronic dies disposed above the second surface; and
- wherein the second contacts and the third contacts are for interconnection with the second microelectronic dies in same a package as the first microelectronic dies.

14. The microelectronic assembly according to claim 11, wherein:
- the first contacts of the first block and the fourth contacts of the fourth block are first control and address signal contacts for the first microelectronic dies; and
- the second contacts of the second block and the third contacts of the third block are second control and address signal contacts for the second microelectronic dies.

15. The microelectronic assembly according to claim 14, wherein
- the first contacts of the first L-shaped region and the fourth contacts of the fourth L-shaped region are first data signal contacts for the first microelectronic dies; and
- the second contacts of the second L-shaped region and the third contacts of the third L-shaped region are second data signal contacts for the second microelectronic dies.

16. The microelectronic assembly according to claim 9, wherein the first microelectronic dies include:
- a first memory die and a second memory die spaced apart from one another with each in a latitudinal orientation;
- a third memory die and a fourth memory die spaced apart from one another with each in a longitudinal orientation; and
- the first memory die, the second memory die, the third memory die, and the fourth memory die define a second central region.

17. The microelectronic assembly according to claim 9, wherein the first microelectronic dies and the second microelectronic dies are of a memory module having a single rank and at least two channels.

18. A method for forming a microelectronic assembly, comprising:
- obtaining a first substrate having a first surface and a second surface on opposite sides of the first substrate;
- forming a plurality of contact arrangements on the first surface of the first substrate;
- wherein the plurality of contact arrangements comprises:
  - first contacts disposed as a first ring array of the plurality of contact arrangements on the first surface;
  - second contacts disposed interior to the first contacts as a second ring array of the plurality of contact arrangements on the first surface;
  - third contacts disposed interior to the second contacts as a third ring array of the plurality of contact arrangements on the first surface;
  - fourth contacts disposed interior to the third contacts on the first surface;
  - wherein the first ring array, the second ring array, and the third ring array are concentric rings with the fourth contacts in a central region of the concentric rings;
  - wherein the first contacts and the fourth contacts are for interconnection with first microelectronic dies; and
  - wherein the second contacts and the third contacts are for interconnection with second microelectronic dies in same a package as the first microelectronic dies.

19. The method according to claim 18, further comprising:
- obtaining a second substrate having a third and a fourth surface on opposite sides of the second substrate; and
- interconnecting the first contacts and the fourth contacts respectively to first stack wires and second stack wires;

wherein the first stack wires and the second stack wires extend from the second surface of the first substrate for interconnecting to the third surface of the second substrate;

wherein the second surface and the third surface define an interior region therebetween for the second microelectronic dies disposed above the second surface.

20. The method according to claim 19, further comprising:

interconnecting the second contacts and the third contacts respectively to the second microelectronic dies disposed above the second surface; and interconnecting the first stack wires and the second stack wires to the first microelectronic dies disposed above the fourth surface.

* * * * *